(12) United States Patent
Kawamura et al.

(10) Patent No.: US 6,635,365 B2
(45) Date of Patent: Oct. 21, 2003

(54) ORGANIC ELECTROLUMINESCENT DEVICE AND METHOD OF MANUFACTURE THEREOF

(75) Inventors: Hisayuki Kawamura, Chiba (JP);
Hiroaki Nakamura, Chiba (JP);
Chishio Hosokawa, Chiba (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 10/123,169

(22) Filed: Apr. 17, 2002

(65) Prior Publication Data

US 2002/0155319 A1 Oct. 24, 2002

Related U.S. Application Data

(63) Continuation of application No. 09/671,296, filed on Sep. 27, 2000, now Pat. No. 6,416,888, which is a continuation of application No. PCT/JP00/00832, filed on Feb. 15, 2000.

(30) Foreign Application Priority Data

Feb. 15, 1999 (JP) ............................. 11-036420
Feb. 15, 1999 (JP) ............................. 11-036421
May 14, 1999 (JP) ............................. 11-134997

(51) Int. Cl.[7] .......................... B32B 19/00; B32B 9/00
(52) U.S. Cl. .......................................... 428/690
(58) Field of Search ................... 428/690, 917, 428/212, 332; 313/504, 506, 509

(56) References Cited

U.S. PATENT DOCUMENTS

| 5,294,810 A | 3/1994 | Egusa et al. ................. 257/40 |
| 5,349,209 A | 9/1994 | Moyer et al. ................. 257/80 |
| 5,589,733 A | * 12/1996 | Noda et al. |
| 5,981,092 A | 11/1999 | Arai et al. ................. 428/690 |
| 6,180,217 B1 | 1/2001 | Ueda et al. ................. 428/212 |
| 6,215,245 B1 | * 4/2001 | Mori ................. 313/506 |
| 2001/0009351 A1 | * 7/2001 | Hosokawa et al. ......... 313/504 |
| 2001/0019783 A1 | * 9/2001 | Sakai et al. ................. 428/690 |

FOREIGN PATENT DOCUMENTS

| EP | 0 388 768 | 9/1990 |
| EP | 0 980 104 | 2/2000 |
| JP | 3-77299 | 4/1991 |
| JP | 7-147456 | 6/1995 |
| JP | 9-268284 | 10/1997 |
| JP | 11-067459 | * 3/1999 |
| JP | 11-204266 | 7/1999 |
| WO | WO 97/47050 | 12/1997 |
| WO | WO 00/48431 | 8/2000 |

* cited by examiner

*Primary Examiner*—Cynthia H. Kelly
*Assistant Examiner*—Dawn L. Garrett
(74) *Attorney, Agent, or Firm*—Oblon, Spivak, McClelland, Maier & Neustadt, P.C.

(57) ABSTRACT

An organic EL device having a low driving voltage and exhibiting high luminous brightness and superior durability, and a method of manufacturing the same. The organic EL device has an anode layer, an organic light-emitting layer, and a cathode layer. An inorganic thin layer, comprising an inorganic compound of Ge, Sn, Zn, Cd, etc. and an inorganic compound of an element of Group 5A to Group 8 in the periodic table in combination, is provided between the anode layer and the organic light-emitting layer and between the cathode layer and the organic light-emitting layer, or the anode layer or the cathode layer comprises a chalcogenide of Si, Ge, Sn, Pb, Ga, In, Zn, Cd, Mg, etc. and an inorganic compound of an element of Group 5A to Group 8 in the periodic table in combination.

12 Claims, 6 Drawing Sheets

ORGANIC ELECTROLUMINESCENT DEVICE AND METHOD OF MANUFACTURE THEREOF

CROSS REFERENCE TO RELATED APPLICATION

This application is a Continuation of application Ser. No. 09/671,296, filed on Sep. 27, 2000 now U.S. Pat. No. 6,416,888, which is a Continuation of PCT/JP00/00832, filed Feb. 15, 2000.

TECHNICAL FIELD

The present invention relates to an organic electroluminescent device (hereinafter may be called "organic EL device") and a method of manufacturing the organic EL device. More particularly, the present invention relates to an organic EL device suitably used for display apparatuses for home use or industrial use, light sources for printer heads, and the like, and to a method of manufacturing the organic EL devices.

BACKGROUND ART

Development of organic EL devices with an organic light-emitting layer inserted between electrodes of the devices have intensively been undertaken for the following reasons.

(1) Handling and production of organic EL devices become easy because the organic EL devices are complete solid elements.

(2) Organic EL devices do not require the additional luminous apparatuses because these devices can emit the light themselves.

(3) Organic EL devices are suitable for use with display apparatuses due to excellent visibility.

(4) A full color display can be easily provided using the organic EL devices.

However, because the organic light-emitting layer is an organic substance, injecting electrons from a cathode layer is not easy. In addition, because the organic substance generally can transfer electrons and positive holes only with difficulty, the organic light-emitting layer tends to deteriorate easily and produce leakage current when used for a long period of time.

Japanese Patent Application Laid-open No. 8-288069 discloses an organic EL device provided with an insulating thin layer between an electrode and an organic light-emitting layer as a means for extending the life of the organic EL device. The organic EL device disclosed in this patent application has a configuration in which an insulating thin layer of aluminum nitride, tantalum nitride, or the like is provided between an anode layer and an organic light-emitting layer or between a cathode layer and an organic light-emitting layer.

U.S. Pat. No. 5,853,905 discloses an organic EL device provided with an insulating thin layer between an anode layer and a light-emitting layer or a cathode layer and a light-emitting layer. The U.S. patent also discloses $SiO_2$, MgO, and $Al_2O_3$ as materials for forming the insulating thin layers.

With an objective of providing an organic EL device at low cost without using expensive materials such as 4,4',4"-tris[N-(3-methylphenyl)-N-phenylamino]triphenylamine (hereinafter may be abbreviated as "MTDATA") and tetraaryldiamine derivatives, Japanese Patent Application Laid-open No. 9-260063 discloses an organic EL device having an inorganic material layer comprising NiO and at least one compound selected from the group consisting of $In_2O_3$, ZnO, $SnO_2$, and compounds containing B, P, C, N, or O, or an inorganic material layer of $Ni_{1-x}O$ ($0.05 \leq x \leq 0.5$) between an electrode and an organic light-emitting layer.

With an objective of extending the life of organic EL devices by reducing the energy difference between the work function of an anode layer and the ionization energy of a positive hole transport layer, Japanese Patent No. 2824411 discloses an organic EL device having an anode layer made of a conductive metal oxide material exhibiting a work function greater than indium tin oxide (ITO) such as $RuO_x$, $MoO_3$, and $V_2O_5$, for example. This Japanese Patent proposes in the specification an anode layer having a two layer structure consisting of these conductive metal oxide materials and an ITO to improve the light transmittance.

However, the inorganic compounds such as aluminum nitride, tantalum nitride, $SiO_2$, and the like used as an insulating thin layer in the organic EL devices disclosed in Japanese Patent Application Laid-open No. 8-288069 and U.S. Pat. No. 5,853,905 have a great ionization potential which results in an increased driving voltage. Specifically, because the inorganic thin layers consisting of these inorganic compounds are electric insulating layers having an excessively large ionization energy, positive holes are injected from the anode layer by a tunnel effect. Therefore, a high driving voltage is required between the electrodes of the organic EL device to obtain a desired luminous brightness.

The organic EL device disclosed in Japanese Patent Application Laid-open No. 9-260063 is characterized by the use of NiO as a major component, which unduly limits the types of materials usable as an inorganic material layer and exhibits only a low luminous efficiency.

The organic EL device disclosed in Japanese Patent No. 282411 has the problems of small positive hole mobility and insufficient durability in spite of the use of the metal oxide materials such as $RuO_x$ ($1 \leq x \leq 2$), $MoO_3$, and $V_2O_5$.

In addition, the metal oxide materials such as $RuO_x$ ($1 \leq x \leq 2$), $MoO_3$, and $V_2O_5$ exhibit a large optical absorption coefficient of 27,000 $cm^{-1}$ or more, giving rise to remarkable coloration. Therefore, the light transmittance in the visible radiation range of the anode layer made of these metal oxide materials is very low, for example, about ⅛ to ⅕ that of ITO, giving rise to problems such as a poor luminous efficiency and a small quantity of light which can be emitted.

In addition, even an anode layer with a two-layer structure consisting of lamination of a thin film of these metal oxide materials and ITO exhibits only a small light transmittance (about ½ that of ITO). Such an anode layer cannot be used in practice. Moreover, when an anode layer having such a two-layer structure is fabricated, the thickness of the ITO and a metal oxide film must be restricted within a prescribed range, resulting in a limitation in the manufacturing process.

The present inventors have conducted extensive studies to overcome the above problems and have found that, even in the case where an inorganic thin layer is provided in an organic EL device, an intermediate level for injection of electric charges can be formed in the inorganic thin layer by forming the inorganic thin layer from a combination of several specific inorganic compounds.

The inventors have further found that the combined use of specific inorganic compounds for forming the inorganic thin layer may produce an organic EL device with excellent transparency and durability, and superior luminous brightness at a low applied voltage (for example, less than DC 10V).

Accordingly, an object of the present invention is to provide an organic EL device having a specific inorganic thin layer and exhibiting excellent durability, a low driving voltage, and superior luminous brightness, as well as a method of efficiently manufacturing such an organic EL device.

Another object is to provide an organic EL device having an electrode layer made from a combination of specific inorganic compounds and exhibiting excellent durability, a low driving voltage, and superior luminous brightness, as well as a method of efficiently manufacturing such an organic EL device.

DISCLOSURE OF THE INVENTION (1) One embodiment of the present invention (first invention) which is an organic EL device having an anode layer, an organic light-emitting layer, and a cathode layer is characterized by having a first inorganic thin layer formed between the anode layer and the organic light-emitting layer or a second inorganic thin layer formed between the cathode layer and the organic light-emitting layer, or having both the first and the second inorganic thin layers, wherein when the first inorganic thin layer is formed between the anode layer and the organic light-emitting layer, the intermediate level of the first inorganic thin layer is set at a value smaller than the ionization potential of the organic light-emitting layer; when the second inorganic thin layer is formed between the cathode layer and the organic light-emitting layer, the intermediate level of the second inorganic thin layer is set at a value greater than the electron affinity of the organic light-emitting layer; and an electric charge is injected through either the intermediate level of the first inorganic thin layer or the intermediate level of the second inorganic thin layer, or both.

This constitution enables charges to be injected with ease without utilizing a tunnel effect. Thus, an excellent organic EL device having a low driving voltage and exhibiting high luminous brightness and durability may be obtained.

The intermediate energy level in an inorganic thin layer will now be explained referring to FIGS. 7(a) and 7(b). FIG. 7(a) shows the relationship between an intermediate level in the inorganic thin layer on the anode layer side and an energy level in the organic light-emitting layer, and FIG. 7(b) shows the relationship between an intermediate level in the inorganic thin layer on the cathode layer side and an energy level in the organic light-emitting layer. In FIGS. 7(a) and 7(b), the intermediate level (Ei) of the first and the second inorganic thin layers is indicated between a valence band level (the ionization potential of the inorganic thin layer, Ev) and a conduction band level (the electron affinity of the inorganic thin layer, Ec).

Specifically, the intermediate level (Ei) in this inorganic thin layer is defined as the energy level which exists between Ev and Ec.

When a first inorganic thin layer is formed between the anode layer and the organic light-emitting layer in the present invention, the intermediate level (Ei) of the first inorganic thin layer is set at a value smaller than the energy level directed to the ionization potential (Ip) of the organic light-emitting layer, so that positive holes may be easily injected into the intermediate level (Ei) of the first inorganic thin layer from the anode layer as energy by applying a prescribed voltage. The positive holes then energetically move through the intermediate level (Ei) and are easily injected into the positive hole level (HOMO: Highest Occupied Molecular Orbital) in the organic light-emitting layer. This movement of the positive holes is schematically indicated by a dotted line in FIG. 7(a).

On the other hand, when a second inorganic thin layer is formed between the cathode layer and the organic light-emitting layer in the present invention, the intermediate level (Ei) of the first inorganic thin layer is set at a value larger than the energy level directed to the electron affinity (Af) of the organic light-emitting layer, so that electrons may be easily injected into the intermediate level (Ei) of the second inorganic thin layer from the cathode layer as energy by applying a prescribed voltage. Then, the electrons energetically move through the intermediate level (Ei) and are easily injected into the electron level (LUMO: Lowest Unoccupied Molecular Orbital) in the organic light-emitting layer. This movement of the electrons is schematically indicated by a dotted line in FIG. 7(b).

In either case, even if an inorganic thin layer is provided in the organic EL device, positive holes and electrons easily move in the inorganic thin layer without using a tunnel effect, whereby the driving voltage is decreased and luminous brightness is increased.

In addition, durability may be remarkably improved by providing an inorganic thin layer like this.

Moreover, the first inorganic thin layer formed between the anode layer and the organic luminous body have the function such as an electric barrier which confines electrons in the LUMO level within the organic light-emitting layer due to the wide gap of the energy level.

In the same manner, the second inorganic thin layer formed between the cathode layer and the organic luminous body have the function such as a positive hole barrier which confines positive holes in the HOMO level within the organic light-emitting layer due to the wide gap of the energy level.

An organic layer other than the organic light-emitting layer may be formed between the first inorganic thin layer and the organic light-emitting layer in the present invention in addition to the organic light-emitting layer. In this instance, the intermediate level of the inorganic thin layer is set smaller than the ionization potential of this organic layer. Therefore, in such a case the intermediate level of the inorganic thin layer is not always necessarily smaller than the ionization potential of the organic light-emitting layer.

In the same manner, an organic layer other than the organic light-emitting layer may be formed between the second inorganic thin layer and the organic light-emitting layer. In this instance, the intermediate level of the inorganic thin layer is set greater than the electron affinity of this organic layer. Therefore, in such a case the intermediate level of the inorganic thin layer is not always necessarily greater than the electron affinity of the organic light-emitting layer.

The above-described intermediate level may be determined by measuring the fluorescence spectrum or electronic properties, and may be easily controlled by changing the materials used, for example.

(2) In the first invention, it is desirable that either or both of the first inorganic thin layer and the second inorganic thin layer contain at least one compound selected from the following group A and at least one inorganic compound selected from the following group B.

Group A: A chalcogenide of Si, Ge, Sn, Pb, Ga, In, Zn, Cd, Mg, Al, Ba, K, Li, Na, Ca, Sr, Cs, or Rb, and a nitride thereof Group B: A compound of an element of Group 5A to Group 8 of the periodic table The combined use of the group A and the group B ensures formation of an intermediate level in the inorganic thin layer. Because electric charges may be injected at low voltage through this intermediate level, the organic EL device not only possesses superior durability, but also exhibits high luminous brightness. In addition, the combined use of the group A and the group B does not impair transparency.

(3) In the first invention, it is desirable that the band gap energy of the inorganic thin layer (Ba) and the band gap energy of the organic light-emitting layer (Bh) satisfy the relationship "Ba>Bh".

Such a relationship improves transmittance of light and increases the quantity of light which is emitted out (an efficiency of light taken-out). In addition, such a relationship may increase the barrier characteristics against electrons or positive holes, resulting in an increase in luminous efficiency.

(4) Furthermore, in the first invention, preferably the group A is a chalcogenide of Si, Ge, Sn, Zn, Al, Ba, K, Li, Na, Ca, Sr, Cs, Rb, or Cd, or a nitride thereof.

Because these compounds may particularly maintain an excited state for a long period of time among the group A inorganic compounds, the organic EL device may exhibit a low light-quenching property and increase the quantity of light which is emitted.

(5) Furthermore, in the first invention, preferably the group B is an oxide of Ru, V, Mo, Re, Pd, or Ir.

The use of these compounds ensures formation of an intermediate level in the inorganic thin layer.

In addition, it is desirable that the inorganic thin layer containing these group B is provided between the anode layer and the organic light-emitting layer.

(6) Furthermore, in the first invention, preferably the content of the group B is in the range of 0.1 to 50 atomic % (hereinafter abbreviated as atm % or at. %) for 100 atomic % of the total of the inorganic thin layer.

This range of atomic % of the group B makes it easy to adjust the ionization potential of the inorganic thin layer, while maintaining a high transparency (light transmittance).

(7) Furthermore, in the first invention, preferably the thickness of the inorganic thin layer is in the range of 1 to 100 nm.

This range of thickness produces an organic EL device exhibiting superior durability, a low driving voltage, and high luminous brightness. In addition, the organic EL device does not become unduly thick if the thickness of the inorganic thin layer is maintained in this range.

(8) In another embodiment of the organic EL device of the present invention (second invention) which comprises an anode layer, an organic light-emitting layer, and a cathode layer, either the anode layer or the cathode layer or both comprise at least one compound selected from the following group A-1 and at least one compound selected from the following group B-1, or at least one compound selected from the following group A-2 and at least one compound selected from the following group B-2.

Group A-1: A chalcogenide of Si, Ge, Sn, Pb, Ga, In, Zn, Cd, Mg, Al, Ba, K, Li, Na, Ca, Sr, Cs, or Rb, and a nitride thereof Group B-1: Inorganic compounds of an element of Group 5A to Group 8 in the periodic table and carbon.

Group A-2: A chalcogenide of Ge, Sn, Pb, Ga, In, Zn, Cd, Mg, Al, Ba, K, Li, Na, Ca, Sr, Cs, or Rb, and a nitride thereof Group B-2: Inorganic compounds of an element of Group 5A to Group 8 in the periodic table, chalcogenide of Si and a nitride thereof, and carbon.

The combined use of the group A-1 and group B-1, or of the group A-2 and group B-2 may efficiently increase the ionization potential of the electrode layer. Specifically, the electrode layer has an ionization potential of 5.4 eV or more. Therefore, an organic EL device exhibiting durability, a low driving voltage, and high luminous brightness may be obtained.

In addition, the thus obtained electrode layer may exhibit excellent etching characteristics.

Furthermore, if the electrode layer contains a chalcogenide of Si or a nitride in at least one of the group A-1 and group B-1, or at least one of the group A-2 and group B-2, adherence between the substrate and the electrode layer is further improved and the electrode layer may be formed more uniformly.

When forming an anode layer using these inorganic compounds, it is desirable to set the work function at 4.0 eV or more taking into account injection characteristics of positive holes. On the other hand, when forming a cathode layer using these inorganic compounds, the work function is preferably set at less than 4.0 eV taking into account injection characteristics of electrons.

(9) Furthermore, in the second invention, preferably either the anode layer or the cathode layer or both has a specific resistance of less than 1 $\Omega$·cm.

This is because high resistance of the electrode layer prevents uniformity of luminescence. Therefore, not only may injection characteristics of electrons and positive holes be improved, but also the driving voltage of the organic EL device may be more decreased by restricting the specific resistance in this manner.

On the other hand, if a material for forming electrode layers has a specific resistance of more than 1 $\Omega$·cm, such a material may be used preferably for forming a two-layer structure in combination with another material having a specific resistance of less than 1 $\Omega$·cm.

(10) Furthermore, in the second invention, the inorganic compound of group A-1 or group A-2 is preferably a chalcogenide of Sn, In, or Zn or a nitride thereof.

This is because, among inorganic compounds of group A-1 and group A-2, these inorganic compounds may have particularly small light-quenching characteristics.

Among these inorganic compounds, chalcogenides consisting of combinations of In and Zn are particularly preferred. Because the thin layer consisting of a combination of these inorganic compounds may have a flat surface, the film may have the stable amorphous properties. A thin layer made of a chalcogenide containing only In or In and Sn may have a surface less flat than that of the thin layer made from a chalcogenide containing In and Zn, because the former is crystalline or unstable amorphous.

(11) Furthermore, in the second invention, the compound of group B-1 or group B-2 is preferably an oxide (inorganic compound) of Ru, Re, V, Mo, Pd, or Ir.

The combined use of these inorganic compounds may make it easy to adjust the ionization potential and band gap energy in the electrode layers.

(12) Furthermore, in the second invention, preferably the content of the group B-1 or group B-2 is in the range of 0.5 to 30 atomic % for 100 atomic % of the total of the anode layer or the cathode layer.

This range of atomic % of the group B-1 or group B-2 may make it easy to adjust the ionization potential of the electrode layer, while maintaining a high transparency (light transmittance). In addition, the electrode layer thus obtained may exhibit excellent etching characteristics when an acid or the like is used as an etching agent.

(13) Furthermore, in the second invention, the anode layer or the cathode layer preferably has a thickness in the range of 1 to 100 nm.

This range of thickness may produce an organic EL device exhibiting superior durability, a low driving voltage, and high luminous brightness. In addition, the organic EL device does not become unduly thick if the thickness of the electrode layer is maintained in this range.

(14) Furthermore, in the first and the second inventions, the organic light-emitting layer preferably contains at least one of the aromatic compounds having a styryl group represented by the following formulas (1) to (3).

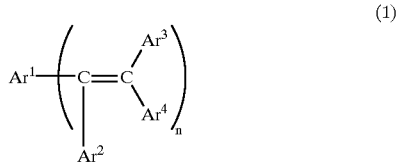
(1)

wherein $Ar^1$ is an aromatic group having 6 to 50 carbon atoms, $Ar^2$, $Ar^3$, and $Ar^4$ are individually a hydrogen atom or an aromatic group having 6 to 50 carbon atoms, provided that at least one of $Ar^1$, $Ar^2$, $Ar^3$, and $Ar^4$ is an aromatic group, and n, which indicates a condensation number, is an integer from 1 to 6.

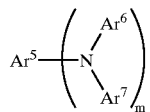
(2)

wherein $Ar^5$ is an aromatic group having 6 to 50 carbon atoms, $Ar^6$ and $Ar^7$ are individually a hydrogen atom or an aromatic group having 6 to 50 carbon atoms, provided that at least one of $Ar^5$, $Ar^6$, and $Ar^7$ has a styryl group which may have a substituent, and m, which indicates a condensation number, is an integer from 1 to 6.

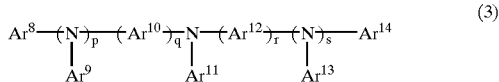
(3)

wherein $Ar^8$ and $Ar^{14}$ are individually an aromatic group having 6 to 50 carbon atoms, $Ar^9$ to $Ar^{13}$ are individually a hydrogen atom or an aromatic group having 6 to 50 carbon atoms, provided that at least one of $Ar^8$ to $Ar^{14}$ has a styryl group which may have a substituent, and p, q, r, and s, which indicate condensation numbers, are individually 0 or 1.

(15) Another embodiment of the present invention (third invention) is a method for manufacturing any one of the above-described organic EL devices, which preferably comprises forming at least one layer in an organic electroluminescence by either a sputtering method or a vacuum deposition method, or both, by using a rotation evaporation apparatus capable of simultaneous evaporation.

This method ensures production of a thin layer with a uniform ratio of components even if a plurality of compounds is used, which consequently enables efficient manufacture of organic EL devices exhibiting high luminous brightness at a low driving voltage, and having excellent durability.

(16) In the third invention, preferably the inorganic thin layer is formed by a sputtering method and the organic light-emitting layer is formed by a vacuum deposition method.

This method of forming ensures production of an inorganic thin layer and an organic light-emitting layer having a precise and uniform thickness. Therefore, an organic EL device which has a uniform luminous brightness may be provided.

BEST MODE FOR CARRYING OUT THE INVENTION

Figure 1:
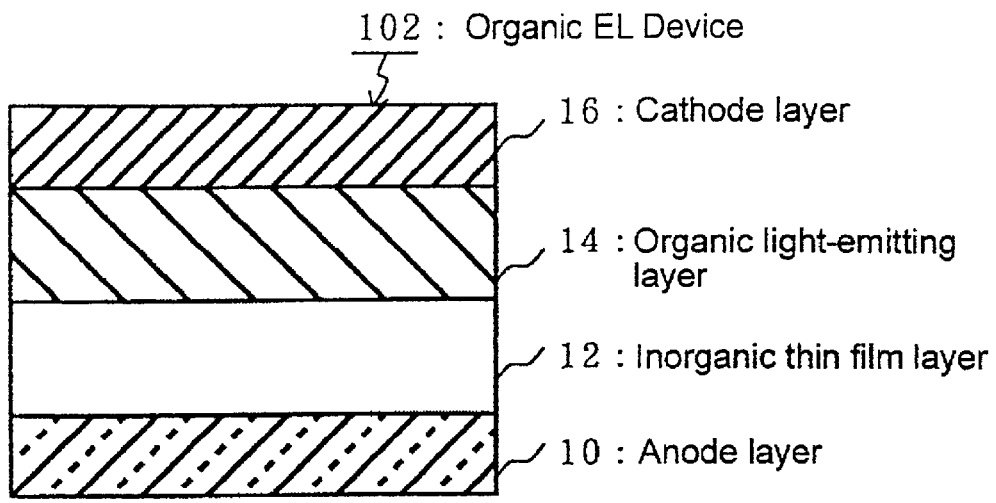
FIG. 1 shows a cross-sectional view of the organic EL device in the first and the second embodiments.

Embodiments of the present invention (first to third inventions) will be explained with references to the drawings. The drawings schematically show the sizes, shapes, and positional relationships of the components to assist understanding of the present invention. Accordingly, the present invention shall not be limited to the embodiments shown in the drawings. Hatching to indicate sections is sometimes omitted in the drawing.

(First Embodiment)

A first embodiment according to the first invention will be explained with reference to FIG. 1. FIG. 1 shows a sectional view of an organic EL device 102 formed by successively laminating an anode layer 10, an inorganic thin layer 12, an organic light-emitting layer 14, and a cathode layer 16 on a substrate (not shown in the drawing).

The first embodiment will now be explained focusing on the inorganic thin layer 12 and the organic light-emitting layer 14 which are characteristic in the first embodiment. Therefore, configurations and methods of manufacture of other components such as, for example, the anode layer 10 and cathode layer 16 are only briefly explained, and conventionally known configurations and methods of manufacture in the field of organic EL devices can be applied to the other parts which are not mentioned here.

(1) Inorganic Thin Layer

Materials

The first and second inorganic thin layers (hereinafter may be simply referred to as "inorganic thin layer") must comprise the inorganic compounds of the following group A and group B in combination.

Group A: A chalcogenide of Si, Ge, Sn, Pb, Ga, In, Zn, Cd, Mg, Al, Ba, K, Li, Na, Ca, Sr, Cs, or Rb, or a nitride thereof Group B: Compounds of an element of Group 5A to Group 8 of the periodic table The reason is that only the combination of the inorganic compounds of group A and group B may produce an organic EL device exhibiting superior durability, a low driving voltage, and high luminous brightness. If either the group A or the group B is solely used, it is difficult to form an intermediate level in the inorganic thin layer. Therefore, it is impossible to decrease the driving voltage or improve durability.

Given as preferable inorganic compounds of group A are $SiO_x$ ($1 \leq x \leq 2$), $GeO_x$ ($1 \leq x \leq 2$), $SnO_2$, $PbO$, $In_2O_3$, $ZnO$, GaO, CdO, MgO, SiN, GaN, ZnS, ZnSe, CdS, CdSe, ZnSSe, CaSSe, MgSSe, GaInN, $LiO_x$ ($1 \leq x \leq 2$), SrO, $CsO_x$ ($1 \leq x \leq 2$), CaO, $NaO_x$ ($1 \leq x \leq 2$), mixtures of these inorganic compounds, and laminates of these inorganic compounds.

Among these group A, a chalcogenide of Si, Ge, Sn, Zn, Cd, Mg, Ba, K, Li, Na, Ca, Sr, Cs, or Rb, and a nitride thereof are preferable.

The reason is that, as partly mentioned above, because these inorganic compounds have a small absorption coefficient, particularly small light-quenching characteristics, and superior transparency among the group A inorganic compounds, it is possible to increase the amount of light which is emitted out.

Preferable inorganic compounds of group A are chalcogenide compounds of Si, Ge, Sn, Zn, Cd, Mg, Al, Ba, K, Li, Na, Ca, Sr, Cs, or Rb, and particularly oxides thereof.

Specific examples of the group B are $RuO_x$ ($1 \leq x \leq 2$), $V_2O_5$, $MoO_3$, $Ir_2O_3$, $NiO_2$, $RhO_4$, $ReO_x$ ($1 \leq x \leq 2$), $CrO_3$, $Cr_2O_3$, $RhO_x$ ($1 \leq x \leq 2$), $MoO_x$ ($1 \leq x \leq 2$), and $VO_x$ ($1 \leq x \leq 2$). These compounds may be used either individually or in combinations of two or more.

Among these group B, oxides of Ru, Re, V, Mo, Pd, and Ir, specifically, $RuO_x$ ($1 \leq x \leq 2$), $ReO_x$ ($1 \leq x \leq 2$), $V_2O_5$, $MoO_3$, $MoO_x$ ($1 \leq x \leq 2$), $PdO_2$, and $Ir_2O_3$ are preferable. The use of these group B ensures formation of an intermediate level in the inorganic thin layer, allowing easy injection of electric charges.

Content

Next, the content of the group B is described. The content of the group B is preferably in the range of 0.1 to 50 atomic % for 100 atomic % of the total of the inorganic thin layer.

If the content of the group B is less than 0.1 atomic %, an intermediate level may not be formed in the inorganic thin layer; if more than 50 atomic %, the inorganic thin layer may be colored or the transparency (light transmittance) may be impaired.

Therefore, in view of balancing formation of an intermediate level in the inorganic thin layer, and transparency, the content of the group B is more preferably in the range of 1 to 30 atomic %, and most preferably 2 to 20 atomic %, for 100 atomic % of the total of the inorganic thin layer.

When an inorganic thin layer is composed of the inorganic compounds of group A and group B, the content of the group A is equivalent to the total amount (100 atomic %) minus the content of the group B. Therefore, when the content of the group B is in the range of 0.1 to 50 atomic %, the content of the group A is in the range of 50 to 99.9 atomic %. However, when a compound other than the group A or the group B (a third component) is present, it is desirable to decide the content of the group A taking into account the content of the third component in the inorganic thin layer.

Thickness

Although the thickness of the inorganic thin layer is not specifically restricted, such a thickness is preferably in the range of 0.5 to 100 nm. If the thickness of the inorganic thin layer is less than 0.5 nm, pin-holes may be produced and a leakage current may be observed when the layer is used for a long time; if more than 100 nm, on the other hand, the driving voltage may increase and luminous brightness may decline.

Therefore, in view of maintaining well balanced durability and a driving voltage, the thickness of the inorganic thin layer is in the range of 0.5 to 50 nm, and preferably 0.5 to 5 nm.

Method of Formation

Next, methods of forming the inorganic thin layer will be explained. Although the method is not specifically limited, a sputtering method, vapor deposition method, spin coat method, casting method, LB method (Langmuir-Blodgett method), and the like may be employed. A radio frequency magnetron sputtering method is particularly preferred.

When using the radio frequency magnetron sputtering method, it is desirable to perform sputtering in an inert gas under vacuum of $1 \times 10^{-7}$ to $1 \times 10^{-3}$ Pa, a layer forming speed of 0.01 to 50 nm/second, and a substrate temperature of $-50°$ C. to $300°$ C.

Light-Emitting Mechanism

Next, the light emitting mechanism when the inorganic thin layer comprising the inorganic compounds of group A and group B is provided will be explained.

As previously mentioned, a conventional organic EL device having an inorganic thin layer consisting of AlN, TaN, and the like has a problem of requiring a high driving voltage because of utilization of a tunnel effect.

Therefore, as previously mentioned, an intermediate level is provided in the inorganic thin layer in the present invention to enable the organic EL device to be driven at a low voltage and to exhibit high luminous brightness. More specifically, by forming an inorganic thin layer from the inorganic compounds of group A and group B, the energy level of the inorganic thin layer is maintained between the energy level of the electrode layer (anode layer, or cathode layer) and the energy level of the organic light-emitting layer. Electric charges are injected through the intermediate level (Ei) thus formed. Because electric charges are easily injected into an organic light-emitting layer in this manner, not only may the organic EL device be driven at a low voltage, but it also exhibits high luminous brightness. In addition, durability of the organic EL device is remarkably improved due to the low driving voltage.

The intermediate level (Ei) in the inorganic thin layer may exist either inside the inorganic thin layer or in the interface of the inorganic thin layer and the organic light-emitting layer.

In addition, it is desirable to set the energy level (Ec) of the inorganic thin layer at a value smaller than the work function of the anode layer (Wa), to prevent electrons from passing through the organic light-emitting layer. In other words, higher luminous brightness may be obtained if the inorganic thin layer is provided with an electronic barrier.

For the same purpose, it is desirable to set the energy level (Ev) of the inorganic thin layer greater than the work function of the cathode layer(Wc), so that positive holes may not pass through the organic light-emitting layer. Specifically, it is possible to cause the inorganic thin layer of the present invention to exhibit the barrier characteristics against positive holes by using a wide gap inorganic thin layer.

(2) Organic Light-Emitting Layer

Function

The organic light-emitting material used as a material for the organic light-emitting layer preferably has the following three functions at the same time.

(a) Electric charge injecting function: the function of allowing positive holes to be injected from the anode layer or the positive hole injection layer during application of electric field and, at the same time, allowing electrons to be injected from the cathode layer or the electron injection layer.

(b) Transport function: the function of allowing injected positive holes and electrons to move by the force of an electric field.

(c) Light-emitting function: the function of providing the field for electrons and positive holes to re-associate, causing them to emit light.

The material does not necessarily possess all of the functions (a) to (c). Some material which exhibits more excellent positive hole injecting and transporting characteristics than electron injecting and transporting characteristics, for example, is suitable as an organic luminescent material. Therefore, a material which may accelerate the movement of electrons in the organic light-emitting layer and may cause the electrons to recombine with positive holes around the center of the organic light-emitting layer is suitably used.

Mobility

To improve recombining capability in the organic light-emitting layer, the electron mobility of the organic light-emitting material is preferably $1\times10^{-7}$ cm²/V·s or more. If less than $1\times10^{-7}$ cm²/V·s, a high-speed response in the organic EL device may become difficult and the luminous brightness may decline.

Therefore, the electron mobility of the organic light-emitting material is more preferably in the range of $1\times10^{-7}$ to $2\times10^{-3}$ cm²/V·s, and particularly preferably $1.2\times10^{-7}$ to $1.0\times10^{-3}$ cm²/V·s.

The reason for restricting the electron mobility to a value smaller than the positive hole mobility of the organic light-emitting material in the organic light-emitting layer is that otherwise not only the organic light-emitting materials usable for the organic light-emitting layer may be unduly limited, but also luminous brightness may decline. On the other hand, the electron mobility of the organic light-emitting material is preferably greater than $1/1,000$ of the positive hole mobility. The reason is that if the electron mobility is excessively small, it may be difficult for the electrons to recombine with positive holes around the center of the organic light-emitting layer and the luminous brightness may decline.

Therefore, the relationship between the positive hole mobility ($\mu_h$) and the electron mobility ($\mu_e$) of the organic light-emitting material in the organic light-emitting layer should preferably satisfy the inequality of $\mu_h/2 > \mu_e > \mu_h/500$, and more preferably of $\mu_h/3 > \mu_e > \mu_h/100$.

Materials

Furthermore, in the first embodiment, it is desirable that the organic light-emitting layer contain one or more aromatic compounds having a styryl group represented by the following formulas (1) to (3) described above (such an aromatic compound may be called "a styryl group-containing aromatic compound"). The above-mentioned conditions for the electron mobility and the positive hole mobility of the organic light-emitting material in the organic light-emitting layer may be easily satisfied by using such a styryl group-containing aromatic compound.

In the formula (1) to (3) representing preferable styryl group-containing aromatic ring compounds, as aryl groups having 5 to 50 nucleus atom numbers among aromatic groups having 6 to 50 carbon atoms, phenyl, naphthyl, anthranyl, phenanthryl, pyrenyl, cholonyl, biphenyl, terphenyl, pyrrolyl, furanyl, thiophenyl, benzothiophenyl, oxadiazolyl, diphenylanthranyl, indolyl, carbazolyl, pyridyl, benzoquinolyl, and the like would be given.

As preferable arylene groups having 5 to 50 nucleus atom numbers, phenylene, naphthylene, anthranylene, phenanthrylene, pyrenylene, cholonylene, biphenylene, terphenylene, pyrrolylene, furanylene, thiophenylene, benzothiophenylene, oxadiazolylene, diphenylanthranylene, indolylene, carbazolylene, pyridylene, benzoquinolylene, and the like may be given.

The aromatic group having 6 to 50 carbon atoms may have a substituent. Given as preferable substituents are alkyl groups having 1 to 6 carbon atoms such as an ethyl group, methyl group, 1-propyl group, n-propyl group, s-butyl group, t-butyl group, pentyl group, hexyl group, cyclopentyl group, and cyclohexyl group; alkoxy groups having 1 to 6 carbon atoms such as an ethoxy group, methoxy group, 1-propoxy group, n-propoxy group, s-butoxy group, t-butoxy group, pentoxy group, hexyloxy group, cyclopentoxy group, and cyclohexyloxy group; aryl groups having 5 to 50 nucleus atom numbers, amino groups substituted by an aryl group having 5 to 50 nucleus atom numbers, ester groups substituted by an aryl group having 5 to 50 nucleus atom numbers, ester groups substituted by an alkyl group having 1 to 6 carbon atoms, a cyano group, a nitro group, and halogen atoms. The above-mentioned substituents may be further substituted by a styryl group.

As specific examples of preferable aromatic compounds having a styryl group shown by the formula (1), compounds shown by the following formulas (4) to (13) may be given.

(4)

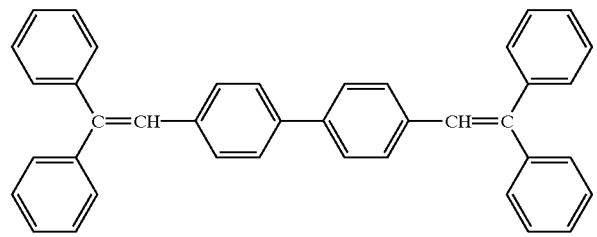

(5)

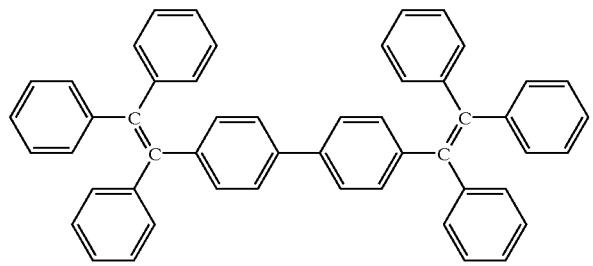

(6)

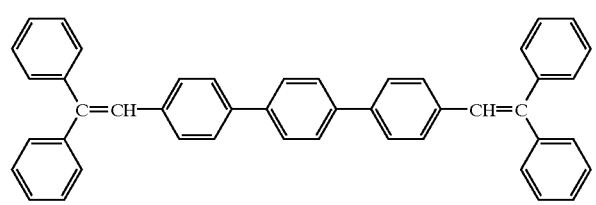

(7)

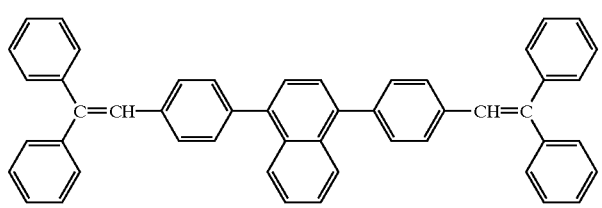

-continued
(8)
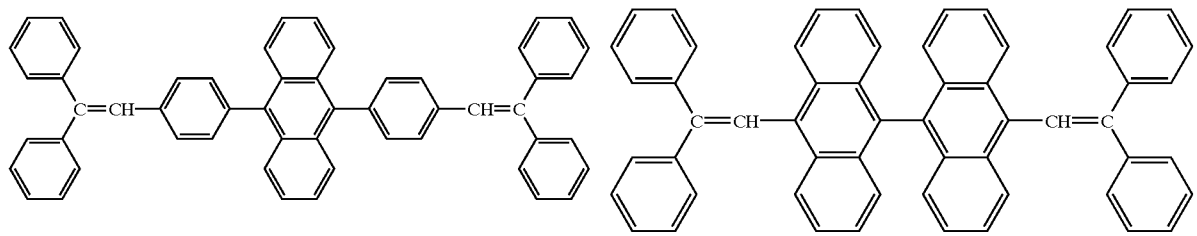
(9)
(10)
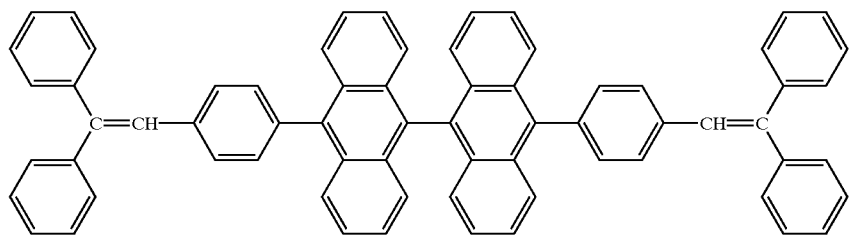
(11)
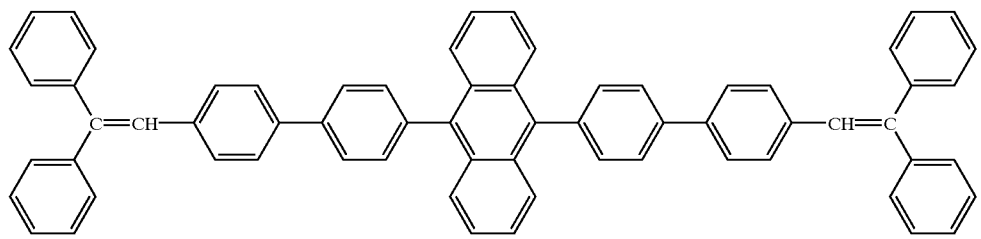
(12)
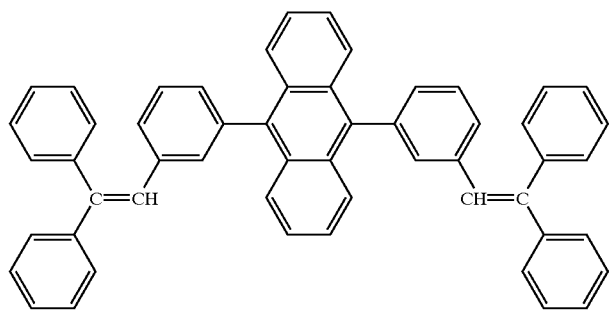
(13)
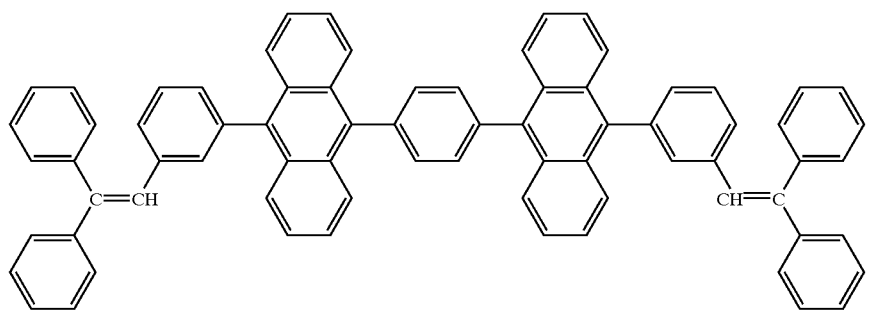

As specific examples of preferable aromatic compounds having a styryl group shown by the formula (2), compounds shown by the following formulas (14) to (35) may be given.
(14)
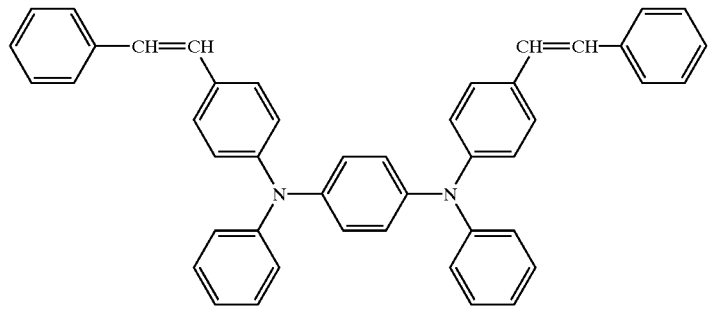
(15)
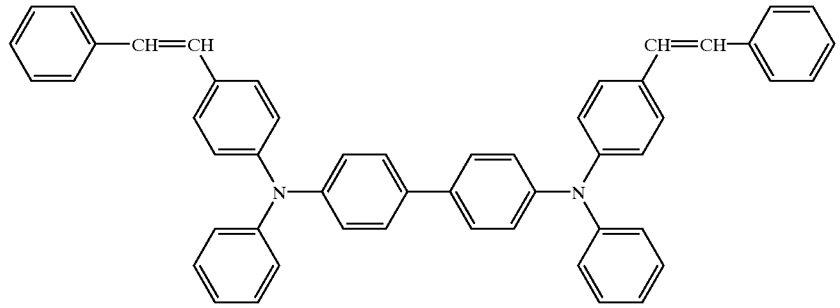
(16) (17)
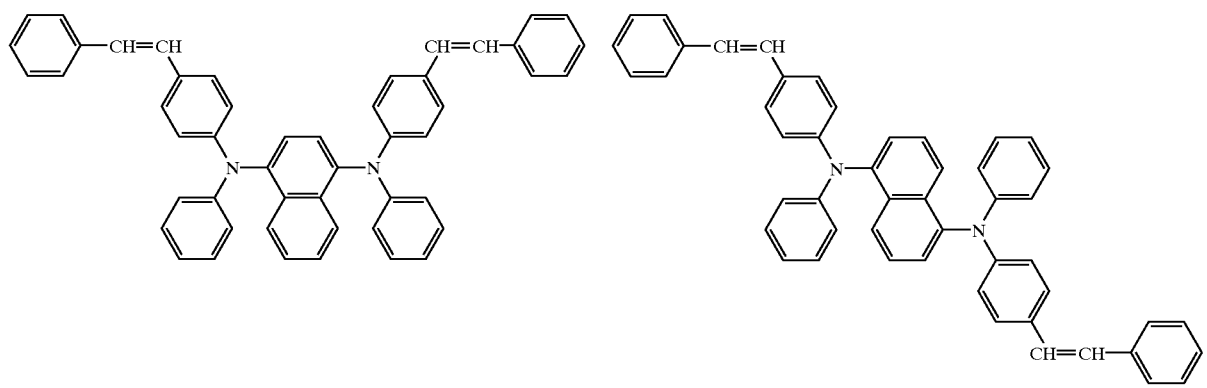
(18)
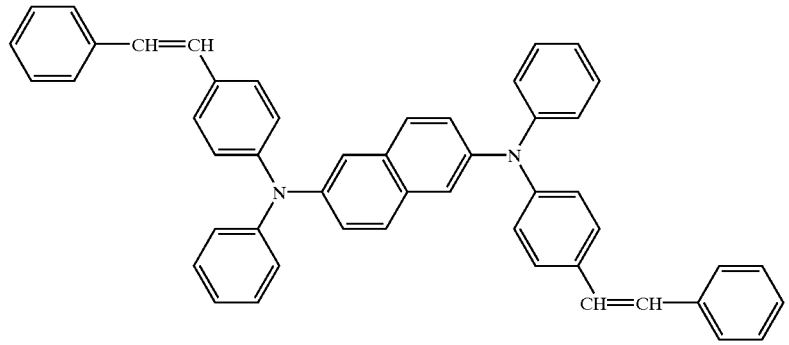

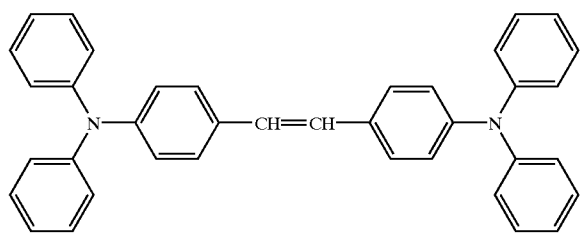
(19)
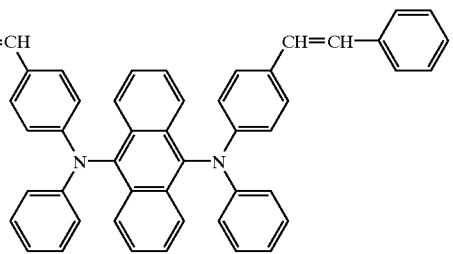
(20)
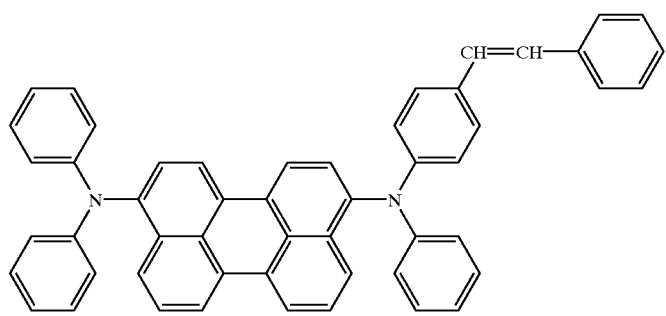
(21)
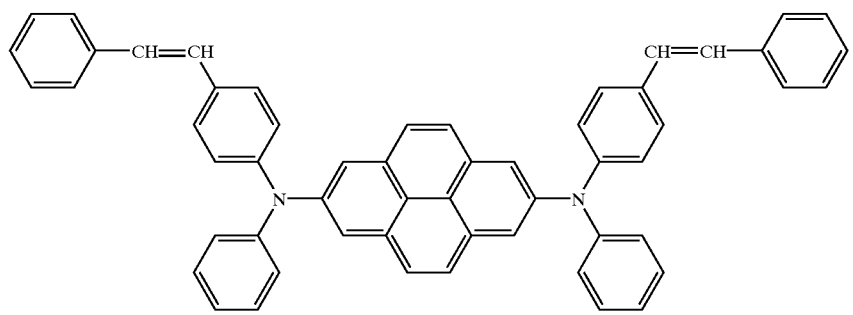
(22)
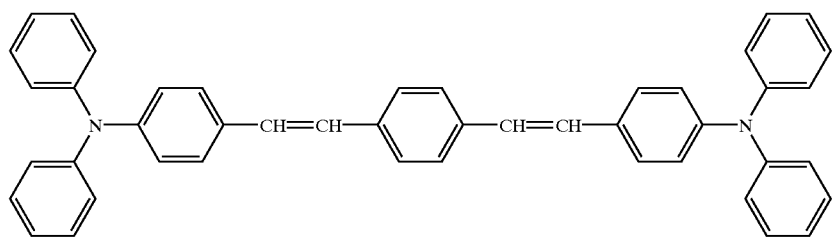
(23)
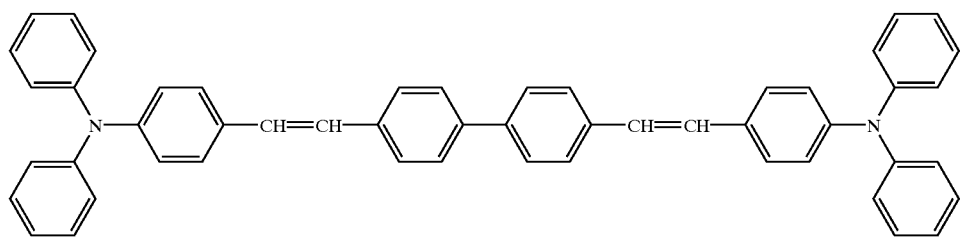
(24)

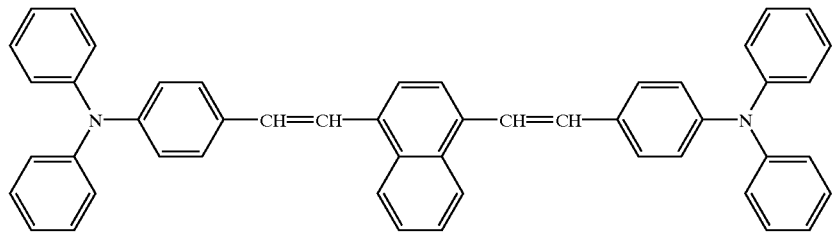
(25)
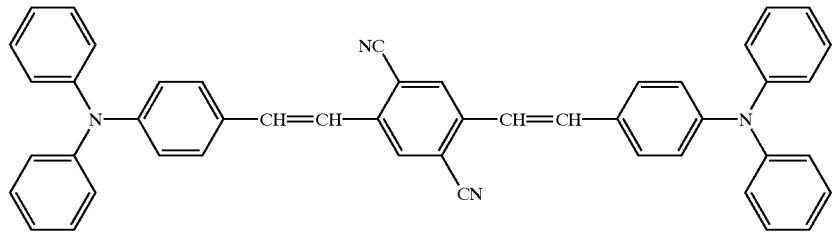
(26)
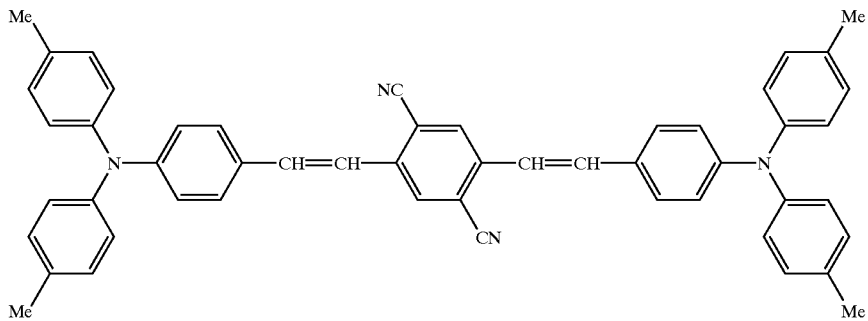
(27)
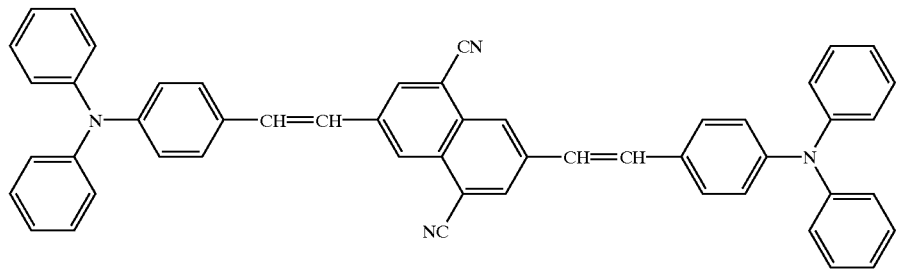
(28)
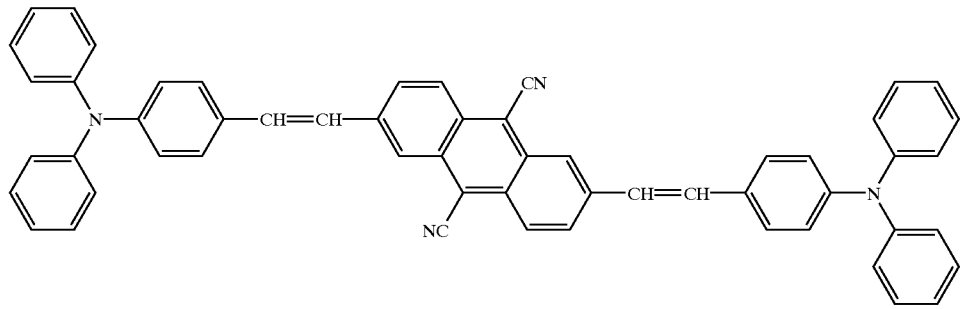
(29)

(30)
(31)
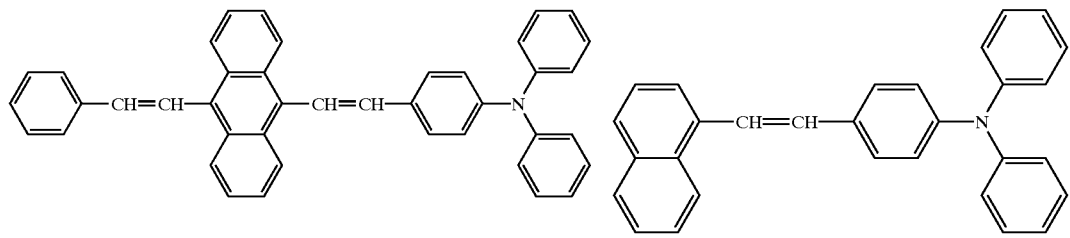
(32)
(33)
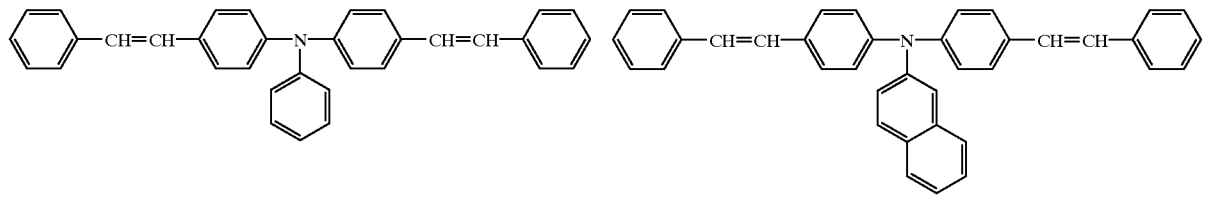
(34)
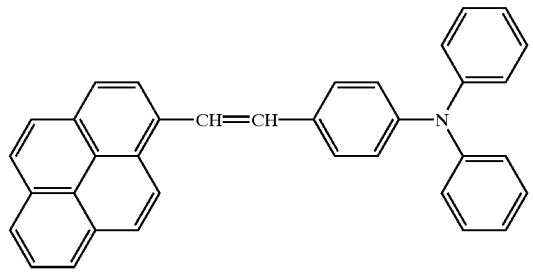
(35)
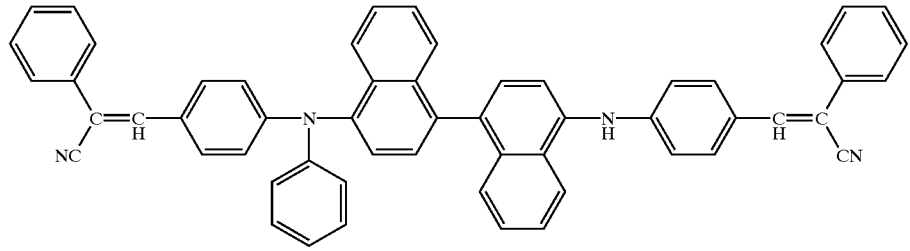
As specific examples of preferable aromatic compounds having a styryl group shown by the formula (3), compounds shown by the following formulas (36) to (44) may be given.
(36)
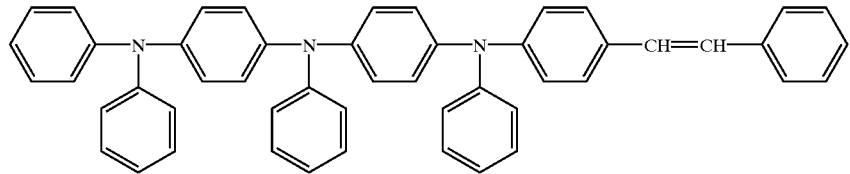

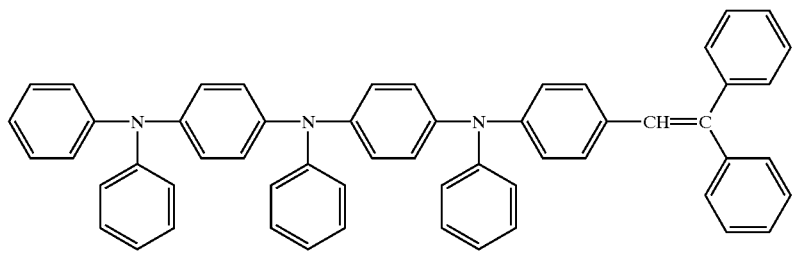
(37)
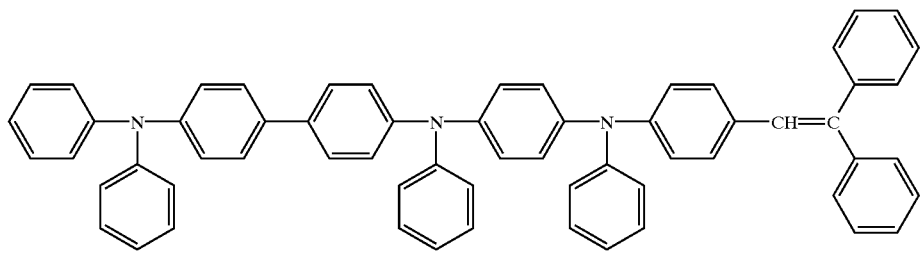
(38)
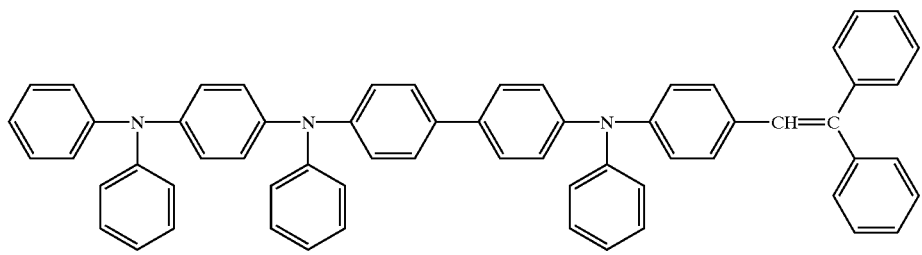
(39)
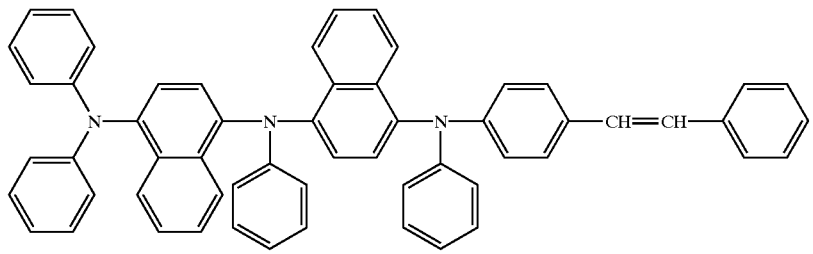
(40)
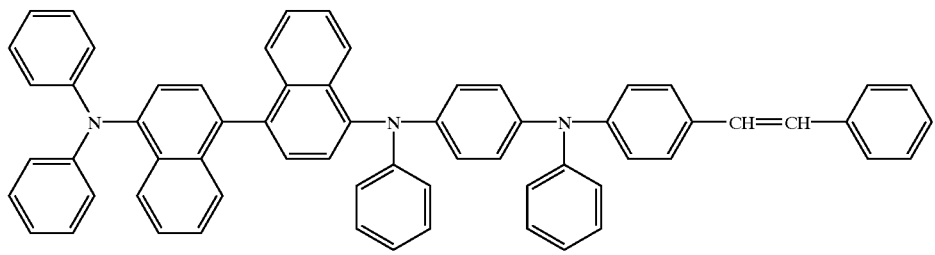
(41)

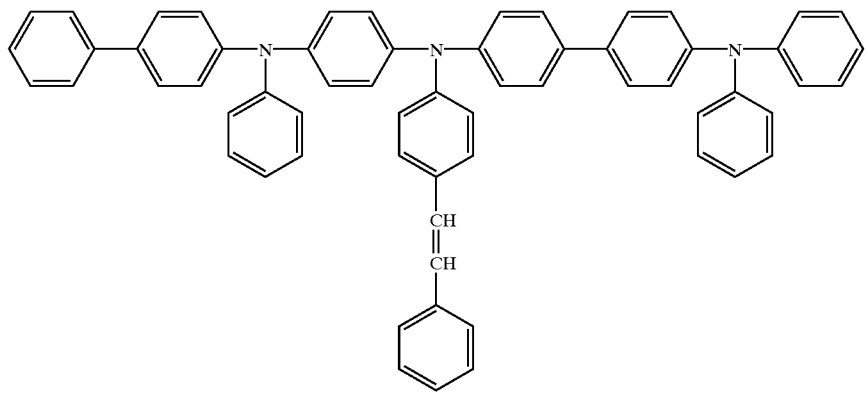

(42)

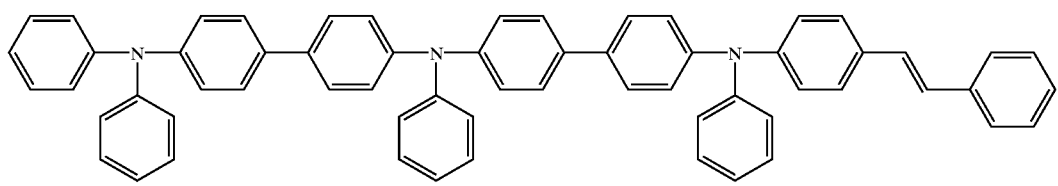

(43)

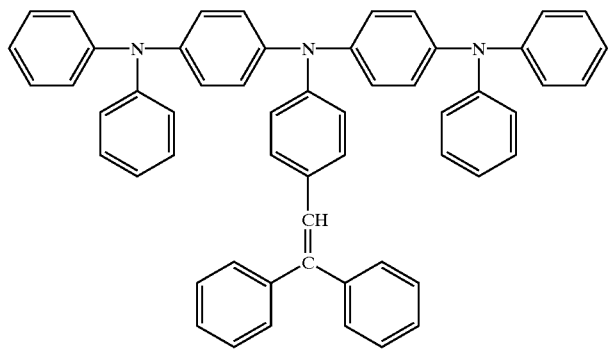

(44)

The organic light-emitting layer may further comprise other compounds. Such other compounds include fluorescent whitening agents such as benzothiazoles, benzoimidazoles, benzooxazoles, and the like; styrylbenzene compounds; and metal complexes having an 8-quinolinol derivative as a ligand which are typified by Alq of the following formula (45).

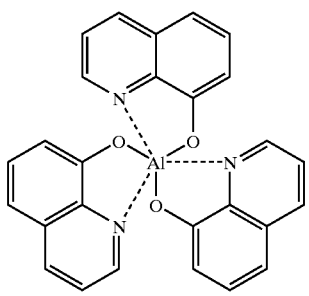

(45)

Furthermore, an organic light-emitting material having a distyrylarylene skeleton, for example, a material prepared by reacting a host substance such as 4,4'-bis(2,2-diphenylvinyl) biphenyl, and a strong fluorescent dye with a color from blue to red, such as a cumarin-based fluorescent dye, or a material doping other fluorescent dye having a similar color to the host substance, may be suitably used together.

Method of Formation

Next, methods of forming the organic light-emitting layer will be explained. Although the method of forming is not specifically limited, a vacuum deposition method, spin coating method, casting method, LB method, sputtering method, and the like may be employed. When using a vacuum deposition method, vacuum deposition is preferably performed at a vacuum deposition temperature of 50 to 450° C. in an inert gas, under vacuum of $1 \times 10^{-7}$ to $1 \times 10^{-3}$ Pa, a layer forming speed of 0.01 to 50 nm/second, and a substrate temperature of −50° C. to 300° C.

The organic light-emitting layer may be also formed by dissolving a binding agent and an organic light-emitting material in a solvent to obtain a solution and by spin-coating the solution to form a thin layer.

In addition, the organic light-emitting layer is preferably a thin layer formed by deposition of a gaseous material by suitably selecting layer-forming methods and conditions, or a molecular deposition layer made by solidification of raw material compounds which are in the form of a solution or a liquid. Such a molecular deposition layer can be distinguished from a thin layer (molecular accumulation layer) formed by the LB method by the differences of aggregation structure and high dimensional structure as well as by the functional differences thereof.

Thickness

The thickness of the organic light-emitting layer is not specifically limited and may be appropriately selected according to the conditions. Preferably, the thickness is in the range of 5 nm to 5 $\mu$m. If the thickness of the organic light-emitting layer is less than 5 nm, luminous brightness and durability may be impaired; if more than 5 $\mu$m, on the other hand, the applied voltage may increase.

Therefore, in view of maintaining well balanced luminous brightness, applied voltages, and the like, the thickness of the organic light-emitting layer is preferably in the range of 10 nm to 3 $\mu$m, and more preferably 20 nm to 1 $\mu$m.

(3) Electrodes

Anode Layer

As an anode layer, metals, alloys, electrically conductive compounds with a large work function (for example, 4 eV or more), or mixtures thereof may be used. Specifically, indium tin oxide (ITO), indium, copper, tin, zinc oxide, gold, platinum, palladium, carbon, and the like may be used either individually or in combinations of two or more.

Although the thickness of the anode layer is not specifically restricted, such a thickness is preferably in the range of 10 to 1,000 nm, and more preferably 10 to 200 nm.

Furthermore, in order to effectively remove light emitted from the organic light-emitting layer, the anode layer should be substantially transparent. Specifically, the anode layer has light transmittance of 10% or more, and preferably 70% or more.

Cathode Layer

As an cathode layer, metals, alloys, electric conductive compounds with a small work function (for example, less than 4 eV), or mixtures thereof may be used. Specifically, magnesium, aluminum, indium, lithium, sodium, cesium, silver, and the like may be used either individually or in combination of two or more.

Although the thickness of the cathode layer is not specifically restricted, such a thickness is preferably in the range of 10 to 1,000 nm, and more preferably 10 to 200 nm.

(4) Others

Although not shown in FIG. 1, it is desirable to provide a sealing layer to cover the entire organic EL device to prevent water and oxygen from entering.

The following materials (a) to (h) may be given as examples of a material preferably used as a sealing layer.

(a) A copolymer obtained by the polymerization of a monomer mixture which contains tetrafluoroethylene and at least one comonomer.

(b) Fluorine-containing copolymers having a cyclic structure in the copolymer main chain.

Copolymers of polyethylene, polypropylene, polymethylmethacrylate, polyimide, polyurea, polytetrafluoroethylene, polychlorotrifluoroethylene, polydichlorodifluoroethylene, or chlorotrifluoroethylene and dichlorodifluoroethylene.

(c) Hygroscopic materials having a water absorption rate of 1% or more or moisture preventing materials.

(d) Metals such as In, Sn, Pb, Au, Cu, Ag, Al, Ti, and Ni.

(e) Metal oxides such as MgO, SiO, $SiO_2$, GeO, NiO, CaO, BaO, $Fe_2O$, $Y_2O_3$, and $TiO_2$.

(f) Metal flurorides such as $MgF_2$, LiF, $AlF_3$, and $CaF_2$.

(g) Liquid fluorocarbons such as perfluoroalkanes, perfluoroamines, and perfluoropolyethers.

(h) Compositions comprising a liquid fluorocarbon and an adsorbent capable of adsorbing water and oxygen dispersed in the liquid fluorocarbon.

A vacuum deposition method, spin coat method, sputtering method, cast method, MBE (molecular beam epitaxy) method, cluster ion beam vapor deposition method, ion plating method, plasma polymerization method (radio frequency exciting ion plating method), plasma CVD (Chemical Vapor Deposition) method, laser CVD method, heat CVD method, gas source CVD method, and the like may be appropriately used for forming the sealing layer.

(Second Embodiment)

A second embodiment based on the second invention will be described below. The second embodiment is an organic EL device 102, which is the same as the above-mentioned first embodiment shown in FIG. 1, except for an improvement in the anode layer 10.

The second embodiment will now be explained focusing on the anode layer 10 which is characteristic in the second embodiment. Therefore, configurations and methods of manufacture of other components such as, for example, the organic light-emitting layer 14 and the like are only briefly explained, and conventionally known configurations and methods of manufacture in the field of organic EL devices can be applied to the other parts which are not mentioned here.

In the second embodiment, although the anode layer 10 shown in FIG. 1 is formed from the compounds of group A (group A-1 or group A-2) and group B (group B-1 or group B-2), these inorganic compounds may be used for the cathode layer 16, provided that the work function is less than 4.0 eV.

It is needless to mention that an inorganic thin layer 12 may be omitted inasmuch as the second embodiment is based on the second invention.

(1) Materials

The anode layer must contain a combination of an inorganic compound of the following group A-1 and a compound of the following group B-1, or a combination of an inorganic compound of the following group A-2 and a compound of the following group B-2. Part of the compounds in the combinations of an inorganic compound of the group A-1 and a compound of the group B-1, and the combinations of an inorganic compound of the group A-2 and a compound of the group B-2 overlap.

Group A-1: A chalcogenide of Si, Ge, Sn, Pb, Ga, In, Zn, Cd, Mg, Al, Ba, K, Li, Na, Ca, Sr, Cs, or Rb, and a nitride thereof Group A-2: A chalcogenide of Ge, Sn, Pb, Ga, In, Zn, Cd, Mg, Al, Ba, K, Li, Na, Li, Ca, Sr, Cs, or Rb, and a nitride thereof Group B-1: Compounds of an element of Group 5A to Group 8 in the periodic table and carbon.

Group B-2: Inorganic compounds of an element of Group 5A to Group 8 in the periodic table, chalcogenide of Si and a nitride thereof, and carbon.

As mentioned above, it may be difficult to efficiently increase the ionization potential to a value above 5.4 eV if only one of the compounds (either an organic compound or an inorganic compound) is used.

Therefore, only the combined use of the inorganic compound of group A-1 and the compound of group B-1, or the combined use of the inorganic compound of group A-2 and the compound of group B-2 as an anode layer may produce an organic EL device exhibiting excellent durability and transparency, a low driving voltage (a low specific resistance), and high luminous brightness.

The compounds in the combination of the inorganic compound of group A-1 and the compound of group B-1, or the combination of the inorganic compound of group A-2 and the compound of group B-2 excel in etching characteristics when etched using an acid, for example, hydrochloric acid or oxalic acid. Such compounds produce a smooth cross-section in the interface of an acid treated area and a non-treated area, enabling a clear distinction between acid treated areas and non-treated areas. Therefore, the electrode layer made from such inorganic compounds may produce electrode patterns with excellent etching precision and is free from breakage, deformation, and an increase in resistance, even if the electrode is very small or the configuration is complex.

Given as preferable inorganic compounds of group A-1 are $SiO_x$ ($1 \leq x \leq 2$), $GeO_x$ ($1 \leq x \leq 2$), $SnO_2$, PbO, $In_2O_3$, ZnO, GaO, CdO, ZnS, ZnCe, CdSe, $In_xZn_yO$ ($0.2 \leq x/(x+y) \leq 0.95$), ZnOS, CdZnO, CdZnS, MgInO, CdInO, MgZnO, GaN, InGaN, MgZnSSe, $LiO_x$ ($1 \leq x \leq 2$), SrO, $CsO_x$ ($1 \leq x \leq 2$), CaO, $NaO_x$ ($1 \leq x \leq 2$), and the like. As an inorganic compound of group A-2, the inorganic compound of group A-1, excluding $SiO_x$ ($1 \leq x \leq 2$), can be given.

Here, ZnO means oxides of Zn and ZnS means sulfides of Zn, wherein the ratio of Zn and O or Zn and S is not necessarily 1:1, but any other ratios are acceptable.

Among the inorganic compounds of group A-1 and group A-2, chalcogenides of Sn, In, or Zn, and a nitride thereof are preferable. The reason is that, as partly mentioned above, because these inorganic compounds of group A-1 and group A-2 have a small absorption coefficient, particularly small light-quenching characteristics, and superior transparency, it is possible to increase the amount of light which can be emitted out.

Among the inorganic compounds of group A-1 and group A-2, chalcogenides consisting of a combination of In and Zn are particularly preferable. The reason is that the inorganic compound which contains this combination is non-crystalline, and not only has excellent etching characteristics or pattern characteristics, but also may produce an inorganic thin layer with excellent evenness.

Among chalcogenide compounds of Ge, Sn, Zn, or Cd, oxides are particularly preferable. Furthermore, the group A-1 compounds containing at least either In or Zn are desirable.

As preferable compounds of group B-1 inorganic compounds, $RuO_x$ ($1 \leq x \leq 2$), $ReO_x$ ($1 \leq x \leq 2$), $V_2O_5$, $MoO_3$, $PdO_2$, $Ir_2O_3$, $RhO_4$, $CrO_3$, $Cr_2O_3$, $MoO_x$ ($1 \leq x \leq 2$), $WO_x$ ($1 \leq x \leq 2$), $CrO_x$ ($1 \leq x \leq 2$), $Nb_2O_5$, $NbO_x$ ($1 \leq x \leq 2$), $PdO_x$ ($1 \leq x \leq 2$), and C (carbon) can be given. These compounds may be used either individually or in combination of two or more.

As preferable compounds of group B-2, in addition to the compounds of group B-1, SiO, $SiO_2$, SiON, or $SiN_x$ ($1 \leq x \leq 3/2$), and the like can be given. These compounds may be used either individually or in combination of two or more.

Among these group B-1 and B-2 compounds, oxides of Ru, Re, V, Mo, Pd, and Ir, specifically, $RuO_x$ ($1 \leq x \leq 2$), $ReO_x$ ($1 \leq x \leq 2$), $V_2O_5$, $MoO_3$, $PdO_2$, and $Ir_2O_3$ are preferable. As partly mentioned above, it is possible to efficiently increase the ionization potential in the anode layer by using these inorganic compounds.

In addition, compounds containing Pd are particularly preferable among the compounds of group B-1 and group B-2. A maximum ionization potential may be obtained if the anode layer contains Pd.

Furthermore, to improve adherence between the anode layer and the substrate when a chalcogenide of Si or a nitride thereof is not included in the compound of group A-2, it is desirable to select a chalcogenide of Si or a nitride thereof as the compound of group B-2.

(2) Content

The content of the group B compounds (compounds of group B-1 or group B-2 may be simply called "group B compounds) will be explained. The content of the group B compound is preferable in the range of 0.5 to 30 atomic % for 100 atomic % of the total of the anode layer. If the content of the group B compound is less than 0.5 atomic %, it may be difficult to adjust the ionization potential of the anode layer to the range of 5.40 to 5.70 eV. On the other hand, if the content of the group B compound is more than 30 atomic %, the anode layer may have a low conductivity, may be colored, or may exhibit impaired transparency (light transmittance).

Therefore, in view of easy adjustment of the ionization potential and well balanced transparency and the like in the anode layer, the content of the group B compound is preferably in the range of 0.8 to 20 atomic %, and more preferably 1 to 10 atomic %, for 100 atomic % of the total of the anode layer.

The content of the group A compounds (compounds of group A-1 or group A-2 may be simply called "group A compounds) is the total of the anode layer (100 atomic %) minus the content of the group B compounds when the anode layer is made from the group A compounds (group A-1 or group A-2) and the group B compounds (group B-1 or group B-2). Therefore, when the content of the group B compounds is 0.5 to 30 atomic %, the content of the group A compounds is in the range of 70 to 99.5 atomic %.

However, when a compound other than the compounds of group A or group B (a third component) is present, it is desirable to decide the content of the group A compounds taking into account the content of the third component in the anode layer.

(3) Thickness and Configuration

Although the thickness of the anode layer is not specifically restricted, such a thickness is preferably in the range of 0.5 to 1,000 nm.

If the thickness of the anode layer is less than 0.5 nm, pin-holes may be produced and a leakage current may be observed when the layer is used for a long period of time; if more than 1,000 nm, on the other hand, transparency of the electrode may be impaired, resulting in low luminous brightness.

Therefore, in view of maintaining well balanced durability and low driving voltage, the thickness of the anode layer is more preferably in the range of 1 to 800 nm, and still more preferably 2 to 300 nm.

There is no specific limitation to the configuration of the anode layer. Either a mono-layer configuration or a multi-layer (two or more layers) configuration is acceptable. Therefore, if high transparency (high light transmittance) and high conductivity is desired, a double layer structure consisting of laminated layers such as a layer of ITO, $In_2O_3$—ZnO, or InZnO, or a metal layer, for example, is preferable.

(4) Specific Resistance

Next, the specific resistance of the anode layer will be described. Although not specifically limited, the specific resistance is preferably less than 1 Ω·cm, for example. If the specific resistance is 1 Ω·cm or more, not only may the luminosity inside the pixels become uneven, but also the driving voltage of the organic EL device may increase. Therefore, to achieve a low driving voltage, the specific resistance of the anode layer is preferably 40 mΩ·cm or less, and more preferably 1 mΩ·cm or less.

The specific resistance of the anode layer can be determined from a surface resistance measurement using a four probe method resistance measurement apparatus and a thickness which is separately measured.

(5) Method of Formation

Next, methods of forming the anode layer will be explained. Although the method is not specifically limited, a sputtering method, vapor deposition method, spin coat method, sol-gel method by means of casting, spray pyrolysis method, ion-plating method, and the like can be employed. A radio frequency magnetron sputtering method is particularly preferred.

More specifically, sputtering conditions of a vacuum degree of $1 \times 10^{-7}$ to $1 \times 10^{-3}$ Pa, a layer forming speed of 0.01 to 50 nm/second, and a substrate temperature of $-50°$ C. to $300°$ C. are preferable.

(Third Embodiment)

Figure 2:
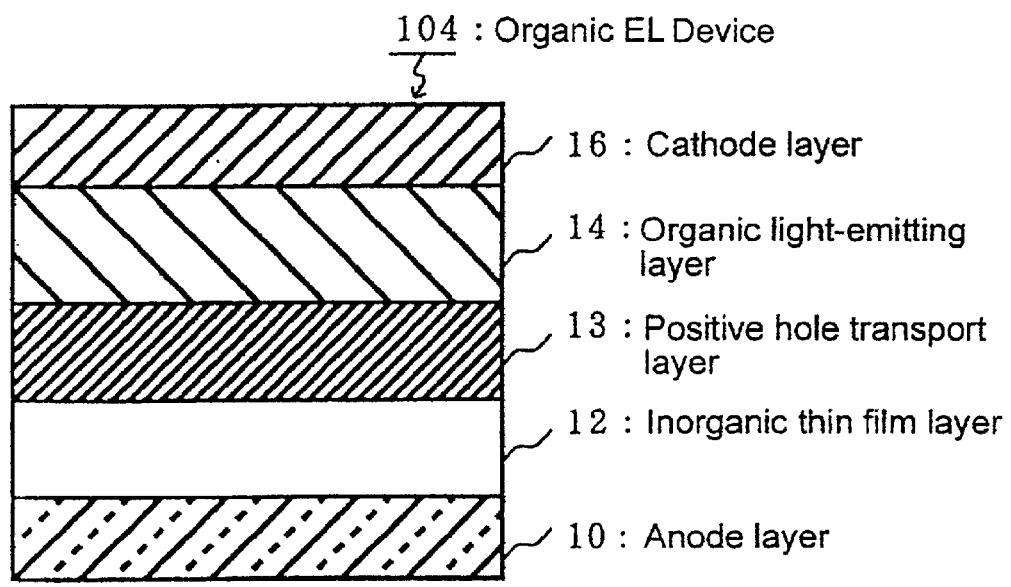
FIG. 2 shows a cross-sectional view of the organic EL device in the third embodiment.

A third embodiment of the present invention will be explained with reference to FIG. 2. FIG. 2 shows a sectional view of an organic EL device 104 of the third embodiment formed by successively laminating an anode layer 10, an inorganic thin layer 12, a positive hole transport layer 13, an organic light-emitting layer 14, and a cathode layer 16 on a substrate (not shown in the drawing).

Injected positive holes may be effectively transported by providing the positive hole transport layer 13. Therefore, transfer of positive holes to the organic light-emitting layer becomes easy and high-speed response of the organic EL device is ensured by providing the positive hole transport layer 13.

The organic EL device 104 of the third embodiment shown in FIG. 2 has the same configuration as the organic EL device 102 of the first and the second embodiments, except for the insertion of the positive hole transport layer 13 between the inorganic thin layer 12 and the organic light-emitting layer 14. Accordingly, the following description is focused on the positive hole transport layer 13 which is characteristic of the third embodiment. Other parts such as the anode layer 16, the organic light-emitting layer 14, and the like are the same as those in the first and the second embodiments.

(1) Materials

The positive hole transport layer is preferably formed from an organic compound or an inorganic compound. As examples of such an organic compound, phthalocyanine compounds, diamine compounds, diamine-containing oligomers, thiophene-containing oligomers, and the like can be given. As examples of desirable inorganic compounds, amorphous silicon (α-Si), α-SiC, microcrystal silicon (μC-Si), μC-SiC, group II-VI compounds, group III-V compounds, amorphous carbon, crystalline carbon, diamond, and the like can be given.

(2) Configuration and Forming Method

The positive hole transport layer is not limited to a mono-layer, but may be a double or triple layer. Although the thickness of the positive hole transport layer is not specifically restricted, this thickness is preferably in the range of 0.5 nm to 5 μm, for example.

There are also no specific limitations to the method of forming the positive hole transport layer. The same method of forming as applied to the formation of positive hole injection layers can be employed.

(Fourth Embodiment)

Figure 3:
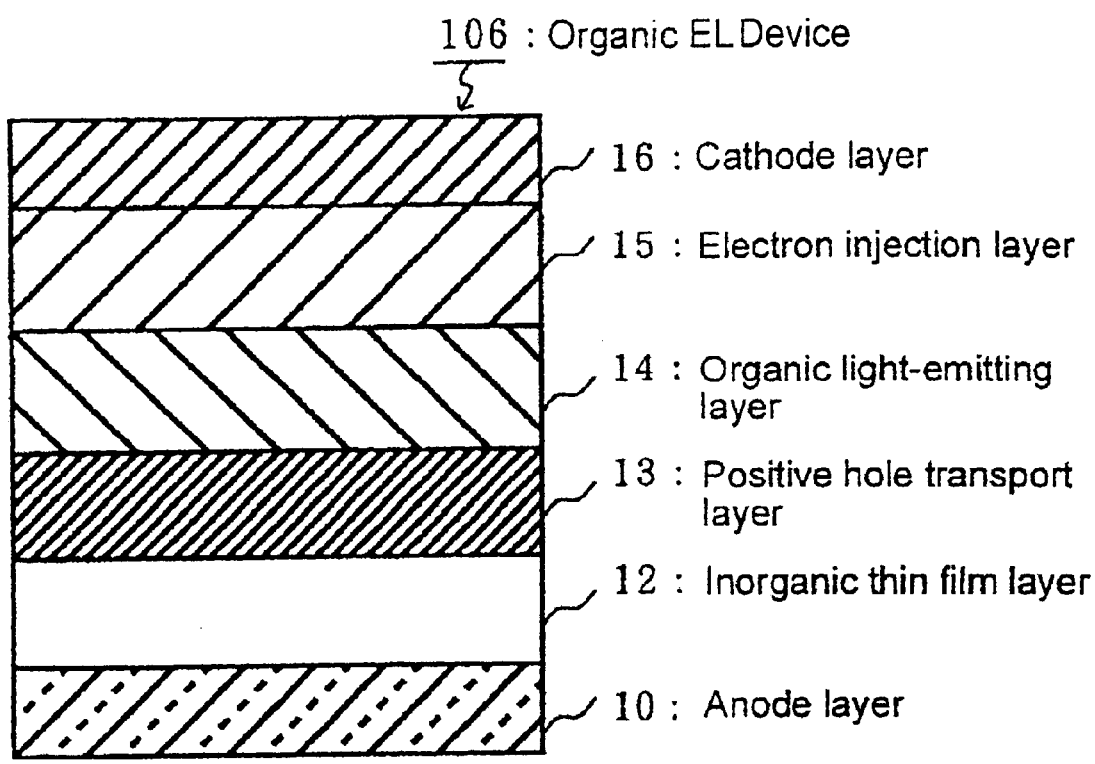
FIG. 3 shows a cross-sectional view of the organic EL device in the fourth embodiment.

A fourth embodiment of the present invention will be explained with reference to FIG. 3. FIG. 3 shows a sectional view of an organic EL device 106 of the fourth embodiment formed by successively laminating an anode layer 10, an inorganic thin layer 12, a positive hole transport layer 13, an organic light-emitting layer 14, and an electron injection layer 15 on a substrate (not shown in the drawing).

Electrons may be effectively injected by providing the electron injection layer 15. Therefore, transferring electrons to the organic light-emitting layer 14 becomes easy, and high-speed response of the organic EL device may be ensured by providing the electron injection layer 15.

The organic EL device 106 of the fourth embodiment shown in FIG. 3 has the same configuration as the organic EL device 104 of the third embodiment, except for the insertion of the electron injection layer 15 between the organic light-emitting layer 14 and the cathode layer 16. Accordingly, the following description is focused on the electron injection layer 15 which is characteristic of the fourth embodiment. Other parts are the same as those in the first to the third embodiments or the configurations known in the field of organic EL devices.

(1) Materials

The electron injection layer is preferably formed from an organic compound or an inorganic compound. The use of an inorganic compound produces organic EL devices with better electron injection performance from a cathode layer and superior durability.

As preferable organic compounds, 8-hydroxyquinoline, oxadizole, and derivatives of these compounds, such as a metal chelate oxynoide compound containing 8-hydroxyquinoline, can be given.

An insulating material or semiconductor are preferably used as an inorganic compound forming the electron injection layer. If the electron injection layer is made from an insulator or a semiconductor, leakage of current may be effectively prevented, resulting in improvement in electron injection performance.

One or more metal compounds selected from the group consisting of alkali metal chalcogenides (oxides, sulfides, selenides, tellurides), alkaline earth metal chalcogenides, alkali metal halides, and alkaline earth metal halides can be used as such an insulator. If the electron injection layer is made from these alkali metal chalcogenides or the like, electron injection performance may be further improved.

As specific examples of preferable alkali metal chalcogenides, $Li_2O$, LiO, $Na_2S$, $Na_2Se$, and NaO can be given. As preferable alkaline earth metal chalcogenides, for example, CaO, BaO, SrO, BeO, BaS, and CaSe can be given. LiF, NaF, KF, LiCl, NaCl, KCl, NaCl, and the like can be given as examples of preferable alkali metal halides. As specific examples of preferable alkaline earth metal halides, fluorides such as $CaF_2$, $BaF_2$, $SrF_2$, $MgF_2$, and $BeF_2$, and halides other than fluorides can be given.

As semiconductors which form the electron injection layer, oxides, nitrides, and oxynitrides containing at least one element selected from Ba, Ca, Sr, Yb, Al, Ga, In, Li, Na, Cd, Mg, Si, Ta, Sb, and Zn can be given. These compounds can be used either individually or in combination of two or more.

The inorganic compounds forming the electron injection layer are preferably in the form of a microcrystalline or amorphous insulating thin layer. If the electron injection layer is formed from these insulating thin layer, pixel deficiencies such as dark spots and the like may be reduced because a uniform and homogeneous thin layer for the electron injection layer may be obtained from these insulating thin layer.

As such an inorganic compound, the above-mentioned alkali metal chalcogenides, alkaline earth metal chalcogenides, alkali metal halides, and alkaline earth metal halides can be given.

In addition, the electron injection layer may be made from a known organic compound having electron transport characteristics, or a mixture of such an organic compound and an alkali metal, for example, a mixture of the above-mentioned metal chelate compound containing 8-hydroxyquilyl (Alq) and Cs.

(2) Electron Affinity

It is desirable that the electron affinity of the electron injection layer in the first embodiment is in the range of 1.8 to 3.6 eV. If the electron affinity is less than 1.8 eV, electron injection performance decreases and the driving voltage increases, resulting in a lowered luminous efficiency; if the electron affinity is more than 3.6 eV, a complex with a low luminous efficiency tends to be produced and a blocking junction may occur.

More preferable range of the electron affinity of the electron injection layer is therefore from 1.9 to 3 eV, and the range from 2 to 2.5 eV is ideal.

In addition, it is desirable that the difference between the electron affinity of the electron injection layer and that of the organic light-emitting layer be 1.2 eV or less, and more preferably 0.5 eV or less. The smaller the difference in the electron affinity, the easier the electron injection from the electron injection layer into the organic light-emitting layer, ensuring a high-speed response of the organic EL device.

(3) Energy Gap

It is desirable that the energy gap (bandgap energy) of the electron injection layer in the first embodiment be 2.7 eV or more, and more preferably 3.0 eV or more.

If the energy gap is greater than a prescribed value, 2.7 eV or more for example, positive holes move to the electronic injection layer through an organic light-emitting layer only with difficulty. The recombining efficiency of positive holes and electrons is thus improved, resulting in an increase in the luminous brightness of the organic EL device and avoiding the case in which the electron injection layer itself emits light.

(4) Configuration

Next, the configuration of the electron injection layer made from an inorganic compound will be described. There is no specific limitation to the configuration of the electron injection layer. Either a mono-layer configuration or a multi-layer (two or more layers) configuration is acceptable.

Although the thickness of the electron injection layer is not specifically restricted, this thickness is preferably in the range of 0.1 nm to 1,000 nm, for example. If the thickness of the electron injection layer made from an inorganic compound is less than 0.1 nm, the electron injection force may decrease or the mechanical strength may be impaired. If the thickness of the electron injection layer made from an inorganic compound is more than 1,000 nm, resistance is too high so that it may be difficult for the organic EL device to exhibit a high-speed response and may take a long time to form the layers. Therefore, the thickness of the electron injection layer made from an inorganic compound is more preferably from 0.5 to 100 nm, and still more preferably from 1 to 50 nm.

(5) Method of Forming

Next, methods of forming the electron injection layer will be explained. The method of forming the electron injection layer is not specifically limited inasmuch as a thin layer with a uniform thickness is obtained. For example, a vacuum deposition method, spin coating method, casting method, LB method, sputtering method, and the like can be employed.

(Fifth Embodiment)

A fifth embodiment of the present invention will be explained with reference to FIGS. 4 to 6. The method of the fifth embodiment ensures production of a thin inorganic layer with a uniform ratio of components even if a plurality of inorganic compounds is used. This consequently provides efficient method of manufacture of organic EL devices exhibiting high luminous brightness at a low driving voltage and having excellent durability.

Specifically, a first feature of the fifth embodiment is forming an inorganic thin layer by using a specific target and a radio frequency magnetron sputtering method.

A second feature of the fifth embodiment is in the use of a plurality of organic light-emitting materials. For example, an organic light-emitting layer with a uniform ratio of components may be obtained by using a plurality of organic light-emitting materials and a rotation vapor deposition method. Such an organic light-emitting layer ensures efficient manufacture of organic EL devices exhibiting high luminous brightness at a low driving voltage, and having excellent durability.

A third feature of the fifth embodiment is providing a vacuum vessel for the radio frequency magnetron sputtering operation and another vacuum vessel for the vacuum deposition operation, and connecting the two vacuum vessels in advance for a continuous operation, wherein, after the vacuum deposition operation, the material is transferred to the vacuum vessel for the radio frequency magnetron sputtering method using a carriage means.

In explaining the method of manufacture according to the fifth embodiment, the organic EL device with the same configuration as that used in the fourth embodiment is used for convenience.

The following layers are prepared using the manufacturing method of the fifth embodiment. The method of manufacturing each layer is as follows.

Anode layer: A radio frequency magnetron sputtering method

Inorganic thin layer: A radio frequency magnetron sputtering method

Positive hole transport layer: A vacuum deposition method

Organic light-emitting layer: A vacuum deposition method

Electron injection layer: A vacuum deposition method

Cathode layer: A vacuum deposition method (1) Formation of Anode Layer and Inorganic Thin Layer In forming an anode layer and an inorganic thin layer using the radio frequency magnetron sputtering method, it is desirable to use a target which consists of the inorganic compounds of group A and group B.

Specifically, the target contains at least the inorganic compounds of group A and group B in a prescribed ratio, and is preferably prepared by homogeneously mixing the raw materials (average particles diameter: 1 $\mu$m) using a solution method (a coprecipitation method) (concentration: 0.01 to 10 mol/l, solvent: polyhydric alcohol, etc., precipitation agent: potassium hydroxide, etc.) or a physical mixing method (stirrer: a ball mill, bead mil, etc., mixing time: 1 to 200 hours), followed by sintering (temperature: 1,200 to 1,500° C., time: 10 to 72 hours, preferably, 24 to 48 hours) and molding (press molding, HIP molding, etc.).

The targets obtained by these methods have uniform characteristics. When molding, the preferable temperature is raised at a rate of 1 to 50° C. per minute.

Because the ratio of components and the like is adjusted only by the sputtering conditions, the inorganic compounds of group A and group B can also be sputtered separately.

Although the conditions of radio frequency magnetron sputtering are not specifically restricted, sputtering is preferably performed in an inert gas such as argon under vacuum of $1\times10^{-7}$ to $1\times10^{-3}$ Pa, a layer forming speed of 0.01 to 50 nm/second, and a substrate temperature of −50° C. to 300° C. These conditions of sputtering ensures production of an inorganic thin layer having a precise and uniform thickness.

(2) Formation of Organic Light-Emitting Layer

A method of forming an organic light-emitting layer by simultaneous vaporization of different vapor deposition materials will now be described referring to FIGS. 4 and 5. Specifically, the method using a vacuum deposition apparatus 201, for example, is characterized by providing a rotation axis line 213A passing through the geometrical center of the substrate 203 around which it is rotated, arranging vapor deposition material containers 212A to 212F at positions apart from the rotation axis line 213A of the substrate 203, and causing the different vapor deposition materials to simultaneously vaporize from the vapor deposition material containers 212A to 212F arranged opposingly to the substrate 203 while rotating the substrate 203 around a rotation axis 213.

Vacuum Deposition Apparatus

The vacuum deposition apparatus 201 shown in FIGS. 4 and 5 has a vacuum vessel 210, a substrate holder 211 installed in the upper portion of the vacuum vessel 210 for securing the substrate 203, and a plurality of (six) vapor deposition material containers 212A to 212F for -filling vapor deposition materials, which are opposingly arranged below the substrate holder 211. This vacuum vessel 210 is designed so that an exhaust means (not shown in the drawing) can maintain the internal pressure at a prescribed reduced pressure. Although six vapor deposition materials are shown in the drawing, the number is not necessarily limited to six. Five or less or seven or more materials are acceptable.

The substrate holder 211 has a holder section 215 which supports the peripheral portion of the substrate 203 and holds the substrate 203 horizontally in the vacuum vessel 210. A rotation axis member 213 for rotating the substrate 203 is provided in the vertical direction upwardly in the center of the substrate holder 211. A motor 214 which is a rotation driving means is connected to the rotation axis member 213. The substrate 203 held in the substrate holder 211 is rotated together with the substrate holder 211 around the rotation axis member 213 by the rotational movement action of the motor 214. The rotation axis line 213A extending from the rotation axis member 213 is set in the vertical direction in the center of the substrate 203.

Method of Forming

Next, a method of forming an organic light-emitting layer 12 on the substrate 203 from two kinds of organic light-emitting materials (a host material and a doping material) by using the vacuum deposition apparatus 201 will be specifically explained.

Figure 5:
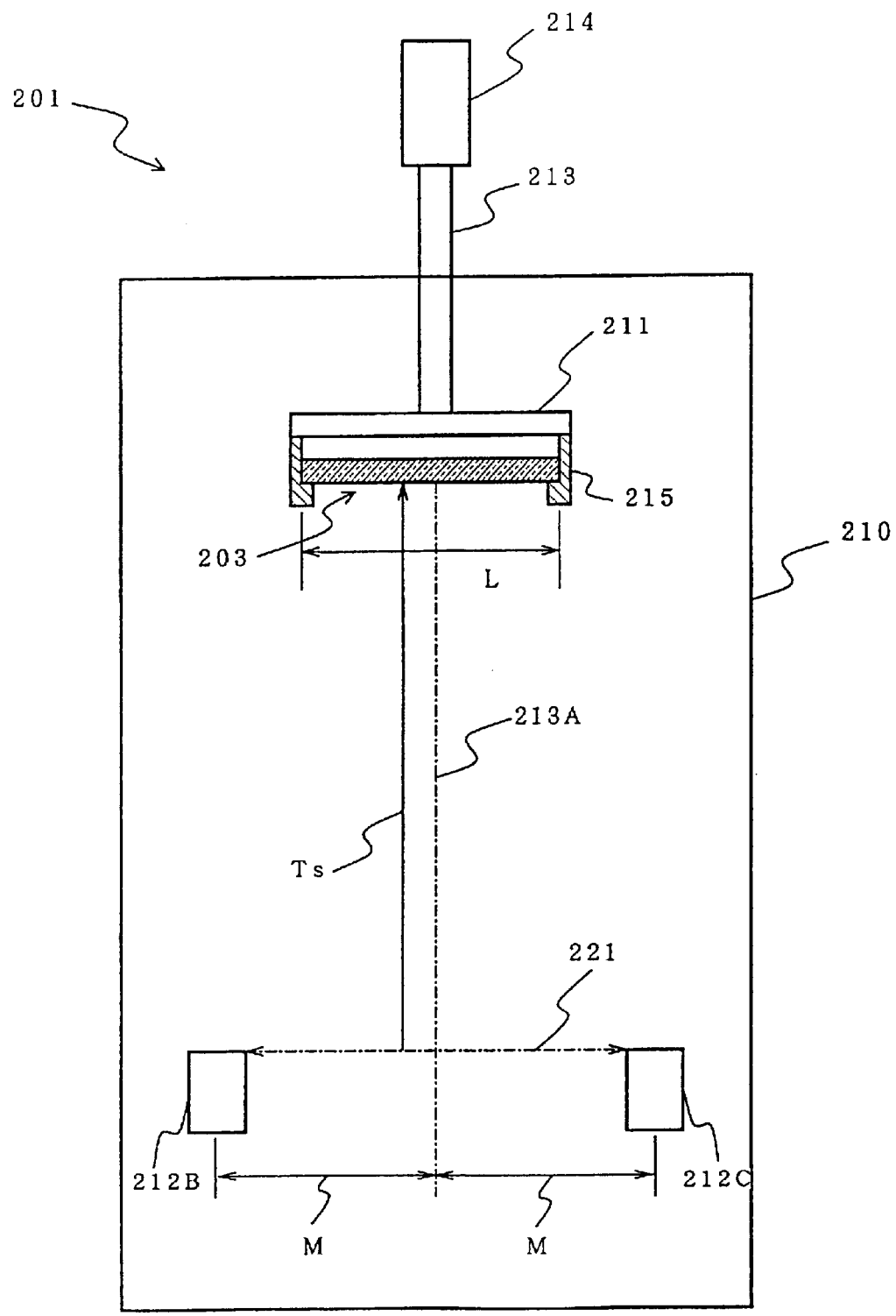
FIG. 5 shows a cross-sectional view of the vacuum deposition apparatus in the fifth embodiment.

First, a square substrate 203 shown in FIG. 5 is caused to engage the holding section 215 of the substrate holder 211 and is horizontally maintained.

Figure 4:
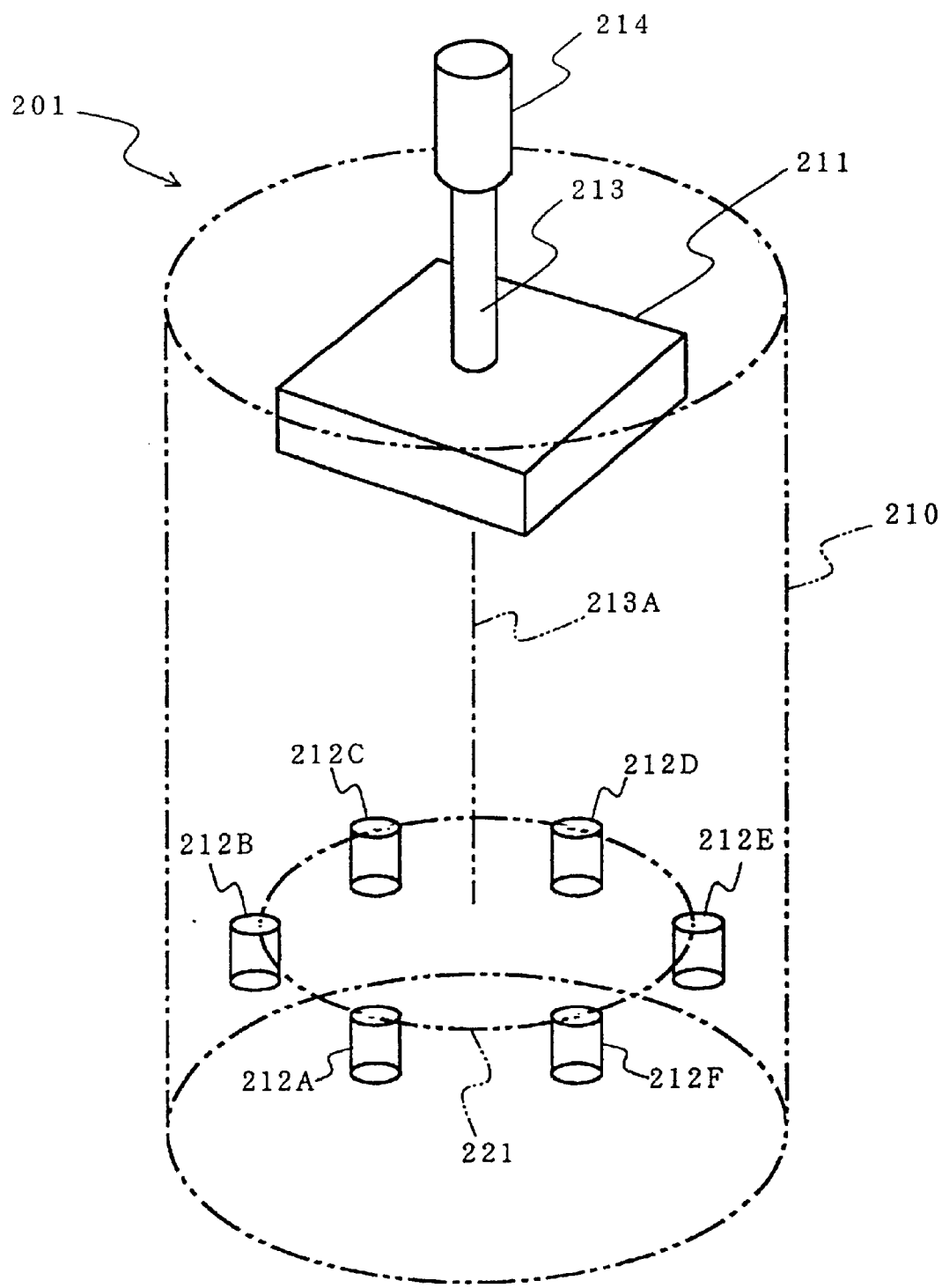
FIG. 4 shows a perspective view of the vacuum deposition apparatus in the fifth embodiment.

In forming the organic light-emitting layer 12, the host material and doping material are filled into each of the two vapor deposition material containers 212B and 212C which are located in juxtaposition on a virtual circle 221 shown in FIG. 4, and pressure in the vacuum vessel 210 is reduced to a vacuum of a prescribed level, $1.0\times10^{-4}$ Torr ($133\times10^{-4}$ Pa), for example, using an exhaust means.

Next, the vapor deposition material containers 212B and 212C are heated to cause the host material and doping material to simultaneously vaporize from the respective containers. At the same time, a motor 214 is driven to rotate the substrate 203 at a prescribed rate, 1 to 100 rpm (revolution per minute) for example, around the rotation axis line 213A. The organic light-emitting layer 12 is formed by causing the host material and doping material to deposit while rotating the substrate 203 in this manner.

Because the vapor deposition material containers 212B and 212C are provided in the positions at a prescribed distance "M" from the rotation axis line 213A of the substrate 203 in the horizontal direction as shown in the FIG. 5, it is possible to regularly change the angle of incidence to the substrate 203 of the vapor deposition materials such as the host material and doping material by rotating the substrate 203.

Therefore, it is possible to cause the vapor deposition materials to become uniformly attached to the substrate 203, thereby ensuring formation of a thin layer with a homogeneous compositional concentration, for instance, with a concentration fluctuation of ±10% (mol conversion).

Because the substrate 203 need not be revolved in performing the vapor deposition, space and equipment for this purpose are unnecessary, thus enabling an economical layer-forming operation in minimum space. Here, to revolve a substrate means to cause the substrate to rotate around an axis which is some distance from its geometric center. This requires a larger space than the case where the substrate rotates around its geometrical center.

Arrangement of Vapor Deposition Material Containers (1)

There are no specific limitations to the configuration of the substrate 203 in carrying out the simultaneous vapor deposition. In the case where the substrate 203 is a plate as shown in FIG. 4, for example, it is desirable to arrange a plurality of vapor deposition material containers 212A to 212F along the perimeter of a virtual circle 221 around the rotation axis line 213A of the substrate 203, so that the relationship "M>(½)×L" is satisfied, wherein "M" is the diameter of the virtual circle 221 and "L" is the length of one side of the substrate 203. When the substrate 203 has sides with different lengths, "L" indicates the length of the longest side.

This arrangement ensures easy control of the compositional ratio of the vapor deposition materials because the vapor deposition materials from a plurality of containers 212A to 212F become attached to the substrate 203 at the same angle of incidence.

In addition, because this arrangement ensures vaporization of the vapor deposition materials at a certain angle of incidence to the substrate 203 and prevent the vapor deposition materials from evaporating at right angles, uniformity of the compositional ratio in the formed layer may be further improved.

Arrangement of Vapor Deposition Material Containers (2)

In performing the method of manufacturing of the fifth embodiment, a plurality of vapor deposition material containers 212A to 212F is arranged along the perimeter of a virtual circle 221 around the rotation axis line 213A of the substrate 203 as shown in FIG. 4. In this instance, it is desirable that the vapor deposition material containers 212A to 212F are arranged with an angle of 360°/n from the center of the virtual circle 221, wherein "n" indicates the number of vapor deposition material containers. For example, when six vapor deposition material containers 212 are provided, it is suitable to place the containers with an angle of 60° from the center of the virtual circle 221.

When arranged in this manner, a plurality of vapor deposition materials is successively superposed on each section of the substrate 203. Therefore, a thin layer with a content of components regularly differing in the direction of the thickness of the layer is easily prepared.

Layer Composition

Next, uniformity of the composition in the organic light-emitting layer formed by the above-mentioned simultaneous vapor deposition method will be discussed in detail. As an example, a thin layer (an electronic injection layer) with a thickness of 1,000 Å (a prescribed value) is prepared by simultaneous vapor deposition using Alq as a host material and Cs as a doping material while rotating the substrate 203 shown in FIG. 6 at 5 rpm under the following conditions.

Cs is used here to increase the electronic conduction of Alq, not as a conventional doping agent to emit light. The following example is given as a typical method of forming uniform layer. Although Cs itself has no light-emitting function, the example is applicable when Cs is replaced with a doping agent with a light-emitting function.

| | |
|---|---|
| Alq deposition rate | 0.1 to 0.3 nm/s |
| Cs deposition rate | 0.1 to 0.3 nm/s |
| Alq/Cs thickness | 1,000 Å (a prescribed value) |

Figure 6:
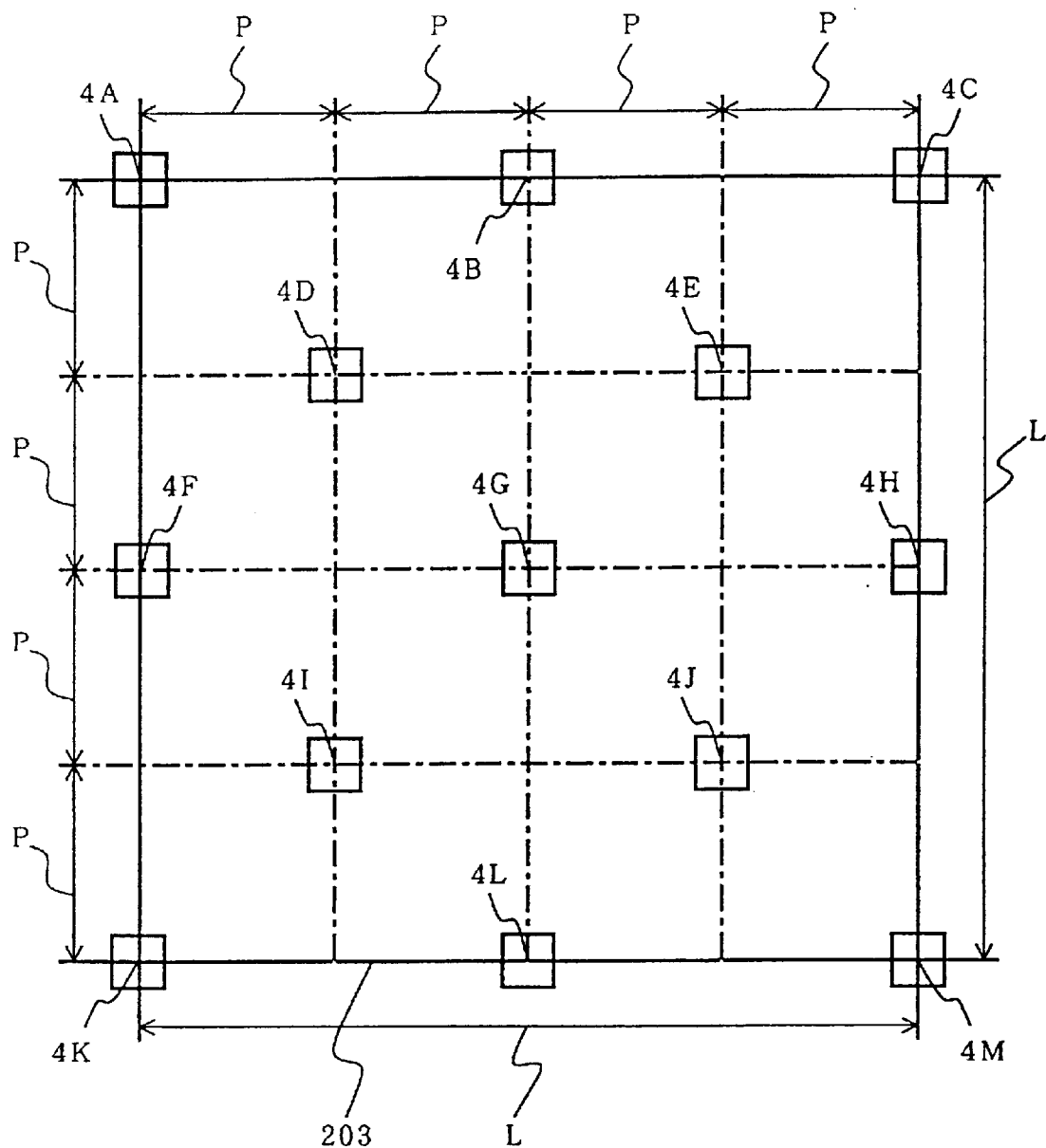
FIG. 6 is a drawing describing measuring points in a substrate.
Figure 7:
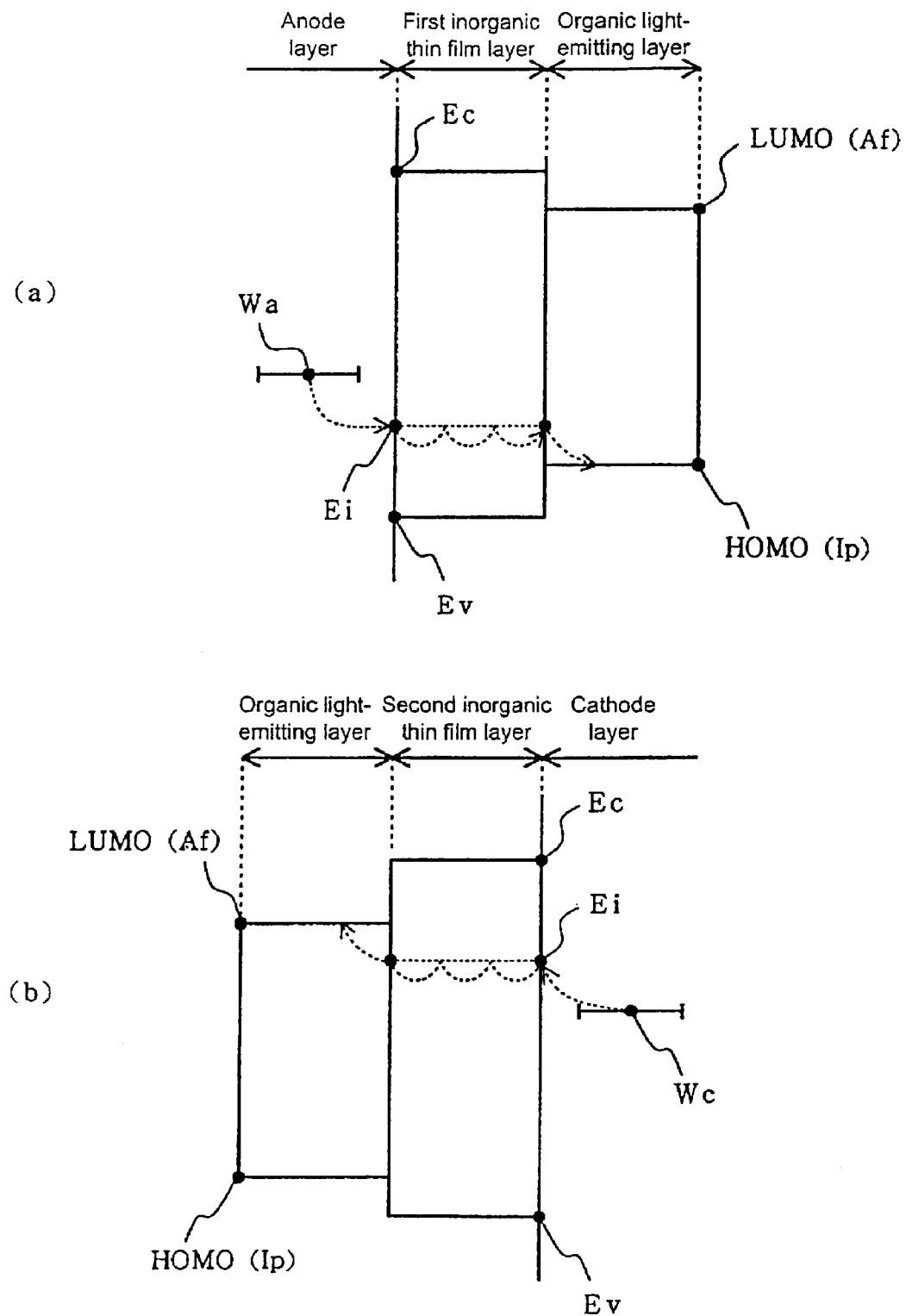
FIG. 7 is a drawing describing an intermediate level.

The thickness of the resulting thin layer at measuring points (4A to 4M) on a glass substrate 203 shown in FIG. 6 was measured using a tracer-type thickness meter. The composition ratio (the atomic ratio) Cs/Al (Al in Alq) at the above measuring points (4A to 4M) was also measured by using an X-ray photoelectron spectrometer (XPS). The measuring points (4A to 4M) on a glass substrate 203 shown in FIG. 6 were determined by dividing the substrate 203 into 16 squares having an equal side length of "P" is 50 mm and arbitrarily selecting the corners (13 corners) of these squares. The results are shown in Table 1.

TABLE 1

| Measuring point | Thickness (Å) | Cs/Al |
|---|---|---|
| 4A | 1,053 | 1.0 |
| 4B | 1,035 | 1.0 |
| 4C | 1,047 | 1.0 |
| 4D | 1,088 | 1.1 |
| 4E | 1,091 | 1.0 |
| 4F | 1,093 | 1.1 |
| 4G | 1,082 | 1.1 |
| 4H | 1,075 | 1.0 |
| 4I | 1,082 | 1.1 |
| 4J | 1,065 | 1.1 |
| 4K | 1,010 | 1.0 |
| 4L | 1,008 | 1.0 |
| 4M | 1,025 | 1.0 |

As a reference example, a thin layer with a thickness of 1,000 Å (a prescribed value) was prepared under the same vapor deposition conditions as in the above simultaneous vapor deposition, except that the substrate 203 was not rotated. The thickness and atomic ratio Cs/Al (Al in Alq) of the resulting thin layer at measuring points (4A to 4M) were measured. The results are shown in Table 2.

TABLE 2

| Measuring point | Thickness (Å) | Cs/Al |
|---|---|---|
| 4A | 895 | 0.6 |
| 4B | 941 | 1.1 |
| 4C | 884 | 1.1 |
| 4D | 911 | 0.7 |
| 4E | 922 | 1.1 |

TABLE 2-continued

| Measuring point | Thickness (Å) | Cs/Al |
|---|---|---|
| 4F | 1,022 | 0.8 |
| 4G | 919 | 1.2 |
| 4H | 1,015 | 1.3 |
| 4I | 1,067 | 0.7 |
| 4J | 908 | 1.2 |
| 4K | 895 | 0.5 |
| 4L | 920 | 1.0 |
| 4M | 950 | 1.1 |

As clear from these results, the minimum thickness and the maximum thickness of the layer prepared by the simultaneous vapor deposition method at the measuring points (4A to 4M) on the surface of the substrate 203 were respectively 1,008 Å (100.8 nm) and 1,093 Å (109.3 nm). Thus, the layer was confirmed to have a very uniform thickness, with a maximum thickness difference of as small as 85 Å, and also to have a very homogeneous composition, with an atomic ratio Cs/Al within the range of 1.0 to 1.1.

On the other hand, the layer prepared by a method differing from the above simultaneous vapor deposition method had a thickness which fluctuated from 884 Å to 1,067 Å at the measuring points (4A to 4M) on the substrate 203. The atomic ratio Cs/Al also showed fluctuations ranging from 0.6 to 1.3.

EXAMPLES

Example 1

(1) Preparation For Manufacturing Organic EL Device

Before manufacturing the organic EL device of Example 1, a transparent electrode layer with a thickness of 75 nm was formed from ITO as an anode layer on a transparent glass substrate with a dimension of thickness:1.1 mm×length:25 mm×width:75 mm. The glass substrate and the anode layer are collectively called a substrate in the following description. This substrate was ultrasonically washed in isopropyl alcohol, dried in a nitrogen gas atmosphere, and washed for 10 minutes using UV (ultraviolet radiation) and ozone.

(2) Formation of Inorganic Thin Layer

Next, the substrate on which an anode layer has been formed was placed in a vacuum vessel for common use as a radio frequency sputtering apparatus and a vacuum deposition apparatus. A target consisting of tin oxide and ruthenium oxide (at a ratio of 10:1) to form an inorganic thin layer was installed in the vacuum vessel. After reducing the pressure in the vacuum vessel to $1\times10^{-5}$ Torr, a mixed gas of oxygen and argon was introduced. An inorganic thin layer with a thickness of 10 nm was formed by sputtering at an output of 100 W and a substrate temperature of 200° C.

(3) Formation of Organic Light-Emitting Layer

Then, switching the function of the vessel from the radio frequency sputtering apparatus to the vacuum deposition apparatus, the substrate was inserted in the substrate holder in the vacuum vessel of the vacuum deposition apparatus, as shown in FIG. 5. The vapor deposition material container 212B was filled with a compound described by the formula (6) (abbreviated as DPVTP) as an organic light-emitting material, the container 212C was filled with a compound described by the formula (24) (abbreviated as DPAVBi) as another organic light-emitting material, the container 212D was filled with Alq which forms an electronic injection layer, the container 212E was filled with a metal (Al) which forms part of a cathode layer, and the container 212F was filled with another metal (Li) which forms part of the cathode layer.

Next, after reducing the pressure in the vacuum vessel to $1 \times 10^{-6}$ Torr or less, an organic light-emitting layer, an electron injection layer, and a cathode layer were sequentially laminated on the substrate consisting of an anode layer and an inorganic thin layer, thereby obtaining an organic EL device. The same vacuum conditions were constantly maintained all through the operation from formation of the organic light-emitting layer through the formation of the cathode layer.

More specifically, DPVTP and DPAVBi were simultaneously vaporized from the vapor deposition material containers 212B and 212C under the following conditions to form an organic light-emitting layer on an inorganic thin layer.

| DPVTP vaporization rate | 0.5 nm/s |
|---|---|
| DPAVBi vaporization rate | 0.1 nm/s |
| DPVTP/DPAVBi thickness | 40 nm |

The method of the fifth embodiment was followed in simultaneously depositing vaporized DPVTP and DPAVBi. Specifically, in forming the organic light-emitting layer, the vapor deposition material containers 212B and 212C were respectively arranged at positions at a distance from the rotation axis line of the substrate of 30 mm in the horizontal direction, and the containers were heated in this positional arrangement to simultaneously vaporize DPVTP and DPAVBi, while rotating the substrate around the rotation axis at 5 rpm.

Next, Alq was vaporized from the vapor deposition material containers 212D under the following conditions to form an An electron injection layer on the organic light-emitting layer.

| Alq vaporization rate | 0.2 nm/s |
|---|---|
| Alq thickness | 5 nm |

Finally, Al and Li were vaporized respectively from the vapor deposition material containers 212E and 212F to form a cathode layer on the electron injection layer, thereby providing an organic EL device.

| Al vaporization rate | 1 nm/s |
|---|---|
| Li vaporization rate | 0.01 nm/s |
| Al/Li thickness | 200 nm |

(4) Evaluation of Organic EL Device

A DC voltage of 8V was applied between the cathode layer (minus (−) electrode) and the anode layer (plus (+) electrode) of the resulting organic EL device. At this time, the current density was 1.5 mA/cm$^2$ and the luminous brightness was 127 nit (cd/m$^2$). In addition, the emitted color was confirmed to be blue. Furthermore, durability was evaluated by driving at a constant current of 10 mA/cm$^2$, to confirm that there was no occurrence of a leakage current after operating for 1,000 hours and longer.

TABLE 3

| | Example | | | |
|---|---|---|---|---|
| | 1 | 2 | 3 | 4 |
| Anode layer material | ITO | ITO | ITO | ITO |
| Ip(eV) | 5.0 | 5.0 | 5.0 | 5.0 |
| Thickness (nm) | 75 | 75 | 75 | 75 |
| Inorganic thin layer material | Sn oxide/Ru oxide | SiO$_x$/Ru oxide | GeO$_x$/Ru oxide | SiO$_x$/Ru oxide (10/1.5) |
| Ip(eV) | 5.53 | 5.53 | 5.47 | 5.54 |
| Thickness (nm) | 1 | 2 | 1 | 5 |
| Light-emitting layer material | DPVTP/DPAVBi | DPVTP/DPAVBi | DPVTP/DPAVBi | DPVTP/DPAVBi |
| Thickness (nm) | 40 | 40 | 40 | 40 |
| Electron injection layer material | Alq | Alq | | Alq |
| Thickness (nm) | 5 | 5 | | 5 |
| Cathode layer material | Al/Li | Al/Li | Al/Li | Al/Li |
| Thickness (nm) | 200 | 200 | 200 | 200 |
| Current density (mA/cm$^2$) | 1.5 | 1.7 | 1.3 | 1.0 |
| Luminous brightness (cd/m$^2$) | 127 | 137 | 114 | 130 |
| Durability | 1,000 hours or longer | 1,000 hours or longer | 1,000 hours or longer | 1,000 hours or longer |
| Transmittance (%) | 83 | 83 | 82 | 83 |

TABLE 4

| | Comparative Example | | |
|---|---|---|---|
| | 1 | 2 | 3 |
| Anode layer material | ITO | ITO | ITO |
| Ip(eV) | 5.0 | 5.0 | 5.0 |
| Thickness (nm) | 75 | 75 | 75 |
| Inorganic thin layer material | | Sn oxide | Ru oxide |
| Ip(eV) | | 4.8 | 5.4 |
| Thickness (nm) | | 10 | 10 |
| Light-emitting layer material | DPVTP/DPAVBi | DPVTP/DPAVBi | DPVTP/DPAVBi |
| Thickness (nm) | 40 | 40 | 40 |
| Electron injection layer material | Alq | Alq | Alq |
| Thickness (nm) | 5 | 5 | 5 |
| Cathode layer material | Al/Li | Al/Li | Al/Li |
| Thickness (nm) | 200 | 200 | 200 |
| Current density (mA/cm$^2$) | 2.2 | 0.9 | 0.6 |
| Luminous brightness (cd/m$^2$) | 127 | 68 | 20 |
| Durability | Less than 1,000 hours | 1,000 hours or longer | 1,000 hours or longer |
| Transmittance (%) | 87 | 80 | 53 |

Examples 2 to 4

In Examples 2 to 4, organic EL devices were prepared in the same manner as in Example 1, except for changing the types of inorganic compounds and the amounts of the components as shown in Table 3. Luminous brightness and the like were evaluated.

As shown in Table 3, the ionization potential of the inorganic thin layer of each Example was 5.4 eV or more. This is presumed to be due to an intermediate level formed in the inorganic thin layer. The ionization energy of DPVTP which is an organic light-emitting material was 5.9 eV, confirming that the value is greater than the intermediate level (an energy value) of the inorganic thin layer.

Comparative Example 1

The organic EL device of Comparative Example 1 was prepared in the same manner as in Example 1, except that an inorganic thin layer was not formed. A DC voltage of 10V was applied to the resulting organic EL device in the same manner as in Example 1. As a result, although the organic EL device emitted blue light, the current density was 2.2 mA/cm$^2$ and the luminous brightness was 127 nit (cd/m$^2$). In addition, when the organic EL device was operated at a constant current of 10 mA/cm$^2$, a leakage current occurred before operating for 1,000 hours and the organic EL device ceased to emit light.

Comparative Example 2

The organic EL device of Comparative Example 2 was the same as that of Example 1, except that an inorganic thin layer was formed using only tin oxide. A DC voltage of 10V was applied to the resulting organic EL device in the same manner as in Example 1. This driving voltage was 2V higher than that used in Examples 1 to 4 (8V).

As a result, although the organic EL device emitted blue light, the current density was 0.9 mA/cm$^2$ and the luminous brightness was 68 nit (cd/m$^2$). The organic EL device was operated at a constant current of 10 mA/cm$^2$ in the same manner as in Example 1 to confirm that a leakage current did not occur after operating for 1,000 hours.

Comparative Example 3

The organic EL device of Comparative Example 3 was the same as that of Example 1, except that an inorganic thin layer was formed using only aluminum nitride. A DC voltage of 10V was applied to the resulting organic EL device in the same manner as in Example 1. This driving voltage was 2V higher than that used in Examples 1 to 4 (8V).

As a result, although emission of blue light was confirmed, the current density was 0.6 mA/cm$^2$ and the luminous brightness was 20 nit (cd/m$^2$). The organic EL device was operated at a constant current of 10 mA/cm$^2$ in the same manner as in Example 1 to confirm that a leakage current did not occur after operating for 1,000 hours.

Examples 5 to 10

In Examples 5 to 10, organic EL devices were prepared in the same manner as in Example 1, except for changing the materials for forming anode layers and inorganic thin layers as shown in Table 5. Luminous brightness and the like were evaluated.

In Example 9, nitrogen gas was added to a mixture of argon gas and oxygen gas. Then the resulting gas mixture was used after plasma-treatment.

In addition, in Example 10 a mixture of argon gas and nitrogen gas was used after plasma-treatment. The results are shown in Table 5, wherein IZO means non-crystalline indium zinc oxide.

TABLE 5

| | Example | | | | | |
|---|---|---|---|---|---|---|
| | 5 | 6 | 7 | 8 | 9 | 10 |
| Anode layer material | IZO | IZO | IZO | IZO | IZO | IZO |
| Ip(eV) | 5.2 | 5.2 | 5.2 | 5.2 | 5.2 | 5.2 |
| Thickness (nm) | 80 | 85 | 90 | 80 | 85 | 85 |
| Inorganic thin layer material | Zn oxide Pd oxide | Zn sulfide Pd oxide | Al oxide Re oxide | Mg oxide Ru oxide | Si oxynitride Pd oxide | Al nitride Pd oxide |
| Ip(eV) | 5.6 | 5.6 | 5.5 | 5.5 | 5.6 | 5.6 |
| Thickness (nm) | 80 | 85 | 90 | 80 | 85 | 85 |
| Light-emitting layer material | DPVTP/ DPAVBi | DPVTP/ DPAVBi | DPVTP/ DPAVBi | DPVTP/ DPAVBi | DPVTP/ DPAVBi | DPVTP/ DPAVBi |
| Thickness (nm) | 80 | 80 | 80 | 80 | 80 | 80 |
| Electron injection layer material | Alq | Alq | Alq | Alq | Alq | Alq |
| Thickness (nm) | 5 | 5 | 5 | 5 | 5 | 5 |
| Cathode layer material | Al/Li | Al/Li | Al/Li | Al/Li | Al/Li | Al/Li |
| Thickness (nm) | 100 | 100 | 100 | 100 | 100 | 100 |
| Current density (mA/cm$^2$) | 1.6 | 1.4 | 1.8 | 1.8 | 1.7 | 1.8 |
| Luminous brightness (cd/m$^2$) | 156 | 145 | 133 | 122 | 144 | 155 |
| Durability | 1,000 hours or longer | 1,000 hours or longer | 1,000 hours or longer | 1,000 hours or longer | 1,000 hours or longer | 1,000 hours or longer |
| Transmittance (%) | 88 | 85 | 86 | 85 | 88 | 88 |

Example 11

(1) Preparation For Manufacturing Organic EL Device
(Preparation of Target)

A mixture of indium oxide powder and iridium oxide powder (average particle diameter: 1 μm or less) was placed in a wet-type ball mill in the amounts so that the molar ratio of Ir/(In+Ir) is 0.02 and pulverized for 72 hours. The resulting pulverized material was granulated and press-molded to form a disk with a diameter of 4 inch and a thickness of 5 mm. The disk was sintered at a temperature of 1,400° C. for 36 hours to obtain a target 1 for an anode layer. A target 2 for an inorganic thin layer consisting of tin oxide and ruthenium oxide (atomic ratio=10:1) was prepared in the same manner.

(2) Formation of Anode Layer

Next, a transparent glass substrate with a dimension of thickness:1.1 mm×length:25 mm×width:75 mm and the target 1 were placed in a vacuum vessel for common use as a radio frequency sputtering apparatus and a vacuum deposition apparatus. The radio frequency sputtering apparatus was operated to form a transparent electrode layer with a thickness 75 nm as an anode layer. After reducing the pressure in the vacuum vessel to 3×10$^{-1}$ Pa, a mixed gas of oxygen and argon was fed. A transparent electrode layer was formed by sputtering in this atmosphere at an output of 100 W and a substrate temperature of 25° C. for 14 minutes.

The glass substrate and the anode layer are collectively called a substrate in the following description. This substrate was ultrasonically washed in isopropyl alcohol, dried in a nitrogen gas atmosphere, and washed for 10 minutes using UV (ultraviolet radiation) and ozone. The ionization potential of the anode layer in the substrate was measured using "AC-1" (Riken Instrument Co., Ltd.) to find that ionization potential was 5.54 eV. In addition, the light transmittance (wavelength 550 nm) of the substrate from which the anode layer was formed was measured to confirm that the light transmittance was 80%.

(3) Formation of Inorganic Thin Layer

The substrate on which an anode layer has been formed was placed in a vacuum vessel for common use as a radio frequency sputtering apparatus and a vacuum deposition apparatus. A target 2 consisting of tin oxide and ruthenium oxide was installed in the vacuum vessel. After reducing the pressure in the vacuum vessel to $1\times10^{-6}$ Torr, an inorganic thin layer with a thickness of 10 nm was formed by sputtering at an output of 100 W and a substrate temperature of 200° C.

(4) Formation of Organic Light-Emitting Layer

Then, switching the function of the vessel from the radio frequency sputtering apparatus to the vacuum deposition apparatus, the substrate was inserted in the substrate holder in the vacuum vessel of the vacuum deposition apparatus, as shown in FIG. 4. The vapor deposition material container 212B was filled with a compound DPVTP which forms part of an organic light-emitting layer, the container 212C was filled with DPAVBi which is another compound forming the organic light-emitting layer, the container 212D was filled with an organic compound Alq which forms an electronic injection layer, the container 212E was filled with a metal (Al) which forms part of a cathode layer, and the container 212F was filled with another metal (Li) which forms part of the cathode layer.

Next, after reducing the pressure in the vacuum vessel to $1\times10^{-6}$ Torr or less, an organic light-emitting layer, an electron injection layer, and a cathode layer were sequentially laminated on the substrate consisting of an anode layer and an inorganic thin layer, thereby obtaining an organic EL device.

The same vacuum conditions have been constantly maintained all through the operation from formation of the organic light-emitting layer through the formation of the cathode layer. More specifically, DPVTP and DPAVBi were simultaneously vaporized from the vapor deposition material containers 212B and 212C under the following conditions to form an organic light-emitting layer on an inorganic thin layer.

| DPVTP vaporization rate | 0.5 nm/s |
| DPAVBi vaporization rate | 0.1 nm/s |
| DPVTP/DPAVBi thickness | 40 nm |

The method of the fourth embodiment was followed in carrying out the simultaneous deposition. Specifically, in forming the organic light-emitting layer, the vapor deposition material containers 212B and 212C were respectively arranged at positions apart from the rotation axis line of the substrate by 30 mm in the horizontal directions, and the containers were heated in this positional arrangement to simultaneously vaporize DPVTP and DPAVBi, while rotating the substrate around a rotation axis at 5 rpm.

Next, Alq was vaporized from the vapor deposition material containers 212D under the following conditions to form an electron injection layer on the organic light-emitting layer.

| Alq vaporization rate | 0.2 nm/s |
| Alq thickness | 5 nm |

Finally, Al and Li were vaporized respectively from the vapor deposition material containers 212E and 212F to form a cathode layer on the electron injection layer, thereby obtaining an organic EL device.

| Al vaporization rate | 1 nm/s |
| Li vaporization rate | 0.01 nm/s |
| Al/Li thickness | 200 nm |

(5) Evaluation of Organic EL Device

A DC voltage of 8V was applied between the cathode layer (minus (−) electrode) and the anode layer (plus (+) electrode) of the resulting organic EL device. At this time, the current density was 1.1 M/cm$^2$ and the luminous brightness was 89 nit (cd/m$^2$). In addition, the emitted color was confirmed to be blue. Furthermore, durability was evaluated by driving at a constant current of 10 mA/cm$^2$, to find that there was no occurrence of a leakage current after the operation of 1,000 hours and longer. The results are shown in Table 6.

Example 12

An organic EL device was prepared in the same manner as in Example 11 except that a target 3 consisting of indium oxide, tin oxide, zinc oxide, and molybdenum oxide, with a molar ratio In/(In+Sn+Zn)=0.6, Sn/(In+Sn+Zn)=0.3, Zn/(In+Sn+Zn)=0.1, and Mo/(In+Sn+Zn+Mo)=0.02, was used instead of the target 1 used in Example 11. The ionization potential of the anode layer was 5.46 eV.

A DC voltage of 8V was applied to the resulting organic EL device between the electrodes to confirm that the current density was 1.4 mA/cm$^2$ and the luminous brightness was 108 nit (cd/m$^2$). In addition, the emitted color was confirmed to be blue.

Example 13

An organic EL device was prepared in the same manner as in Example 11 except that a target 4 consisting of indium oxide, tin oxide, zinc oxide, and palladium oxide, with a molar ratio In/(In+Sn+Zn)=0.6, Sn/(In+Sn+Zn)=0.3, Zn/(In+Sn+Zn)=0.1, and Pd/(In+Sn+Zn+Pd)=0.02, was used instead of the target 1 used in Example 11. The ionization potential of the anode layer was 5.60 eV.

In the same manner as in Example 11, a DC voltage of 8V was applied to the resulting organic EL device between the electrodes to confirm that the current density was 1.4 mA/cm$^2$ and the luminous brightness was 108 nit (cd/m$^2$). In addition, the emitted color was confirmed to be blue.

Example 14

An organic EL device was prepared in the same manner as in Example 11 except that a target 5 consisting of indium oxide, tin oxide, zinc oxide, and rhenium oxide, with a molar ratio In/(In+Sn+Zn)=0.6, Sn/(In+Sn+Zn)=0.3, Zn/(In+Sn+

Zn)=0.1, and Re/(In+Sn+Zn+Re)=0.02, was used instead of the target 1 used in Example 11. The ionization potential of the anode layer was 5.52 eV.

In the same manner as in Example 11, a DC voltage of 8V was applied to the resulting organic EL device between the electrodes to confirm that the current density was 1.2 mA/cm$^2$ and the luminous brightness was 94 nit (cd/m$^2$). In addition, the emitted color was confirmed to be blue.

TABLE 6

| | Example | | | |
|---|---|---|---|---|
| | 11 | 12 | 13 | 14 |
| Anode layer material | In oxide/ Ir oxide | In oxide/ Sn oxide/ Zn oxide/ Mo oxide | In oxide/ Sn oxide/ Zn oxide/ Pd oxide | In oxide/ Sn oxide/ Zn oxide/ Re oxide/ |
| Ip(eV) | 5.54 | 5.46 | 5.60 | 5.52 |
| Thickness (nm) | 75 | 75 | 75 | 75 |
| Light-emitting layer material | DPVTP/ DPAVBi | DPVTP/ DPAVBi | DPVTP/ DPAVBi | DPVTP/ DPAVBi |
| Thickness (nm) | 40 | 40 | 40 | 40 |
| Electron injection layer material | Alq | Alq | Alq | Alq |
| Thickness (nm) | 5 | 5 | 5 | 5 |
| Cathode layer material | Al/Li | Al/Li | Al/Li | Al/Li |
| Thickness (nm) | 200 | 200 | 200 | 200 |
| Current density (mA/cm$^2$) | 1.2 | 1.1 | 1.4 | 1.2 |
| Luminous brightness (cd/m$^2$) | 97 | 89 | 108 | 94 |
| Durability | 1,000 hours or longer | 1,000 hours or longer | 1,000 hours or longer | 1,000 hours or longer |
| Transmittance (%) | 80 | 79 | 77 | 81 |

Examples 15 to 20

Organic EL devices were prepared in the same manner as in Example 11, except for using the targets shown in Table 7 instead of the target 1 in Example 11, the compound described by the formula (8) (hereinafter abbreviated as DPVDPAN) as an light-emitting layer material, and the compound described by the formula (23) (hereinafter abbreviated as PAVB) as a doping material to be added to the light-emitting layer. The results are shown in Table 7.

As clear from the results, although the ionization potentials of the anode layers coincided with the work functions, the values were greater than 5.4 eV in all Examples.

Except for oxides of In an Sn of Example 20, these anode layers were confirmed to be amorphous by the X-ray diffraction measurement.

Moreover, the surface roughness of the anode layers was measured by using a surface roughness meter to confirm that the mean value of the squares was less than 10 nm, confirming that the surfaces were and very smooth.

However, the anode layer of Example 20, which is a mixture of crystals and amorphous materials, exhibited surface roughness of less than 35 nm. The anode partly short-circuited, although a current could flow at a low voltage.

TABLE 7

| | Example | | | | | |
|---|---|---|---|---|---|---|
| | 15 | 16 | 17 | 18 | 19 | 20 |
| Anode layer material | In oxide Zn oxide Pd oxide | In oxide Zn oxide Ir oxide | In oxide Zn oxide Re oxide | In oxide Zn oxide V oxide | In oxide Zn oxide Mo oxide | In oxide Sn oxide Mo oxide |
| B/(A + B + C) | 0.25 | 0.25 | 0.25 | 0.25 | 0.25 | 0.1 |
| C/(A + B + C) | 0.03 | 0.03 | 0.03 | 0.03 | 0.03 | 0.03 |
| Ip(eV) | 5.6 | 5.52 | 5.51 | 5.46 | 5.43 | 5.41 |
| Thickness (nm) | 80 | 85 | 90 | 80 | 85 | 85 |
| Inorganic thin layer material | Zn oxide Pd oxide | Zn sulfide Pd oxide | Al oxide Re oxide | Mg oxide Ru oxide | Si oxynitride Pd oxide | Al nitride Pd oxide |
| Ip(eV) | 5.6 | 5.6 | 5.5 | 5.5 | 5.6 | 5.6 |
| Thickness (nm) | 80 | 85 | 90 | 80 | 85 | 85 |
| Light-emitting layer material | DPVDPAN/ PAVB | DPVDPAN/ PAVB | DPVDPAN/ PAVB | DPVDPAN/ PAVB | DPVDPAN/ PAVB | DPVDPAN/ PAVB |
| Thickness (nm) | 80 | 80 | 80 | 80 | 80 | 80 |
| Electron injection layer material | Alq/Cs | Alq/Cs | Alq/Cs | Alq/Cs | Alq/Cs | Alq/Cs |
| Thickness (nm) | 5 | 5 | 5 | 5 | 5 | 5 |
| Cathode layer material | Al | Al | Al | Al | Al | Al |
| Thickness (nm) | 100 | 100 | 100 | 100 | 100 | 100 |
| Current density (mA/cm$^2$) | 1.4 | 1.5 | 1.5 | 1.6 | 1.8 | 2.8 |
| Luminous brightness (cd/m$^2$) | 156 | 135 | 143 | 142 | 144 | 140 |
| Durability | 1,000 hours or longer | 1,000 hours or longer | 1,000 hours or longer | 1,000 hours or longer | 1,000 hours or longer | 1,000 hours or longer |
| Transmittance (%) | 82 | 75 | 76 | 85 | 85 | 78 |

In the Table 7, A indicates the number of mols of the anode layer material (indium oxide) in the first row; B indicates the number of mols of the anode layer material (zinc oxide) in the second row; and C indicates the number of mols of the anode layer material (palladium oxide) in the third row.

Example 21

An organic EL device was prepared in the same manner as in Example 11 except that a target 6 consisting of indium oxide, tin oxide, zinc oxide, and ruthenium oxide, with a molar ratio In/(In+Sn+Zn)=0.6, Sn/(In+Sn+Zn)=0.3, Zn/(In+Sn+Zn)=0.1, and Ru/(In+Sn+Zn+Ru)=0.02, was used instead of the target 1 used in Example 11. The ionization potential of the anode layer was 5.52 eV.

In the same manner as in Example 11, a DC voltage of 8V was applied to the resulting organic EL device between the electrodes to confirm that the current density was 1.2 mA/cm$^2$ and the luminous brightness was 95 nit (cd/m$^2$). In addition, the emitted color was confirmed to be blue.

Example 22

An organic EL device was prepared in the same manner as in Example 11 except that a target 7 consisting of indium oxide, tin oxide, zinc oxide, and vanadium oxide, with a molar ratio In/(In+Sn+Zn)=0.6, Sn/(In+Sn+Zn)=0.3, Zn/(In+Sn+Zn)=0.1, and V/(In+Sn+Zn+V)=0.02, was used instead of the target 1 used in Example 11. The ionization potential of the anode layer was 5.45 eV.

In the same manner as in Example 11, a DC voltage of 8V was applied to the resulting organic EL device between the electrodes to confirm that the current density was 1.1 mA/cm$^2$ and the luminous brightness was 84 nit (cd/m$^2$). In addition, the emitted color was confirmed to be blue.

Example 23

An organic EL device was prepared in the same manner as in Example 11 except that a target 8 consisting of indium oxide, tin oxide, zinc oxide, and iridium oxide, with a molar ratio In/(In+Sn+Zn)=0.6, Sn/(In+Sn+Zn)=0.3, Zn/(In+Sn+Zn)=0.1, and Ir/(In+Sn+Zn+Ir)=0.02, was used instead of the target 1 used in Example 11. The ionization potential of the anode layer was 5.49 eV.

In the same manner as in Example 11, a DC voltage of 8V was applied to the resulting organic EL device between the electrodes to confirm that the current density was 1.2 mA/cm$^2$ and the luminous brightness was 93 nit (cd/m$^2$). In addition, the emitted color was confirmed to be blue.

Example 24

An organic EL device was prepared in the same manner as in Example 11 except that a target 10 consisting of indium oxide, zinc oxide, and carbon, with a molar ratio In/(In+Zn)=0.78, Zn/(In+Zn)=0.12, and C/(In+Zn+C)=0.1, was used instead of the target 1 used in Example 11. The ionization potential of the anode layer was 5.31 eV.

In the same manner as in Example 11, a DC voltage of 8V was applied to the resulting organic EL device between the electrodes to confirm that the current density was 1.4 mA/cm$^2$ and the luminous brightness was 120 nit (cd/m$^2$). In addition, the emitted color was confirmed to be blue.

Example 25

An organic EL device was prepared in the same manner as in Example 11 except that a target 11 consisting of indium oxide, tin oxide, zinc oxide, and silicon oxide, with a molar ratio In/(In+Sn+Zn)=0.6, Sn/(In+Sn+Zn)=0.2, Zn/(In+Sn+Zn)=0.1, and Si/(In+Sn+Zn+Si)=0.1, was used instead of the target 1 used in Example 11. The ionization potential of the anode layer was 5.26 eV.

In the same manner as in Example 11, a DC voltage of 8V was applied to the resulting organic EL device between the electrodes to confirm that the current density was 1.1 mA/cm$^2$ and the luminous brightness was 90 nit (cd/m$^2$). In addition, the emitted color was confirmed to be blue.

Example 26

An organic EL device was prepared in the same manner as in Example 11 except that a target 12 consisting of indium oxide, tin oxide, zinc oxide, and carbon, with a molar ratio In/(In+Sn+Zn)=0.6, Sn/(In+Sn+Zn)=0.3, Zn/(In+Sn+Zn)=0.1, and C/(In+Sn+Zn+C)=0.02, was used instead of the target 1 used in Example 11. The ionization potential of the anode layer was 5.30 eV.

In the same manner as in Example 11, a DC voltage of 8V was applied to the resulting organic EL device between the electrodes to confirm that the current density was 2.4 mA/cm$^2$ and the luminous brightness was 190 nit (cd/m$^2$). In addition, the emitted color was confirmed to be blue.

Comparative Example 4

An organic EL device was prepared in the same manner as in Example 11 except that a target 9 consisting of indium oxide, tin oxide, and zinc oxide, with a molar ratio In/(In+Sn+Zn)=0.6, Sn/(In+Sn+Zn)=0.3, and Zn/(In+Sn+Zn)=0.1, was used instead of the target 1 used in Example 5. The ionization potential of the anode layer was 5.23 eV.

In the same manner as in Example 11, a DC voltage of 8V was applied to the resulting organic EL device between the electrodes to confirm that the current density was 0.6 mA/cm$^2$ and the luminous brightness was 49 nit(cd/m$^2$). In addition, the emitted color was confirmed to be blue.

TABLE 8

|  | Example | | | | | | Comparative Example |
|---|---|---|---|---|---|---|---|
|  | 21 | 22 | 23 | 24 | 25 | 26 | 4 |
| Anode layer material | In oxide/ Sn oxide/ Zn oxide/ Ru oxide/ | In oxide/ Sn oxide/ Zn oxide/ V oxide/ | In oxide/ Sn oxide/ Zn oxide/ Ir oxide/ | In oxide/ Zn oxide/ Carbon | In oxide/ Sn oxide/ Zn oxide/ Si oxide | In oxide/ Sn oxide/ Zn oxide/ Carbon | In oxide/ Sn oxide/ Zn oxide/ |

TABLE 8-continued

|  | Example | | | | | | Comparative Example |
| --- | --- | --- | --- | --- | --- | --- | --- |
|  | 21 | 22 | 23 | 24 | 25 | 26 | 4 |
| Ip(eV) | 5.52 | 5.45 | 5.49 | 5.31 | 5.26 | 5.30 | 5.23 |
| Thickness (nm) | 75 | 75 | 75 | 75 | 75 | 75 | 75 |
| Light-emitting layer material | DPVTP/ DPAVBi | DPVTP/ DPAVBi | DPVTP/ DPAVBi | DPVTP/ DPAVBi | DPVTP/ DPAVBi | DPVTP/ DPAVBi | DPVTP/ DPAVBi |
| Thickness (nm) | 40 | 40 | 40 | 40 | 40 | 40 | 40 |
| Electron injection layer material | Alq | Alq | Alq | Alq | Alq | Alq | Alq |
| Thickness (nm) | 5 | 5 | 5 | 5 | 5 | 5 | 5 |
| Cathode layer material | Al/Li | Al/Li | Al/Li | Al/Li | Al/Li | Al/Li | Al/Li |
| Thickness (nm) | 200 | 200 | 200 | 200 | 200 | 200 | 200 |
| Current density (mA/cm$^2$) | 1.2 | 1.1 | 1.2 | 1.4 | 1.1 | 2.4 | 0.6 |
| Luminous brightness (cd/m$^2$) | 95 | 84 | 93 | 120 | 90 | 190 | 49 |
| Durability | 1,000 hours or longer | 1,000 hours or longer | 1,000 hour or longer | 1,000 hours or longer | 1,000 hours or longer | 1,000 hours or longer | 1,000 hours or longer |
| Transmittance (%) | 81 | 80 | 81 | 77 | 81 | 78 | 79 |

Industrial Application of the Invention

As described above in detail, according to the present invention even in the case where an inorganic thin layer is provided in an organic EL device, an intermediate level for injection of electron charges may be formed in the inorganic thin layer without using a tunnel effect by forming the inorganic thin layer by a combination of several specific inorganic compounds, for example. Therefore, the present invention provides an organic EL device exhibiting superior durability, a low driving voltage, and high luminous brightness, and method of efficiently manufacturing such an organic EL device.

What is claimed is:

1. An organic electroluminescent device, comprising:
   a) an anode layer;
   b) an organic light-emitting layer;
   c) a cathode layer; and;
   either or both of a first inorganic thin layer formed between the anode layer and the organic light-emitting layer, and a second inorganic thin layer formed between the cathode layer and the organic light-emitting layer,
   either or both of the first and second inorganic thin layers consisting essentially of an oxide of Nb and at least one compound selected from the following group A,
   group A consisting of chalcogenides and nitrides of Si, Ge, Sn, Pb, Ga, In, Zn, Cd, Mg, Al, Ba, K, Li, Na, Ca, Sr, Cs, and Rb.

2. The organic electroluminescent device of claim 1, wherein the compounds of group A are selected from the group consisting of chalcogenides and nitrides of Si, Ge, Sn, Zn, Cd, Al and Mg.

3. The organic electroluminescent device of claim 1, wherein the content of the oxide of Nb is in the range of 0.1 to 50 atomic % for 100 atomic % of the total of the first or second inorganic thin layer.

4. The organic electroluminescent device of claim 1, wherein the thickness of the first or second inorganic thin layer is 1 to 100 nm.

5. The organic electroluminescent device of claim 1, wherein either or both of the first and second inorganic thin layers consists of the oxide of Nb and the at least one compound selected from the group A.

6. An organic electroluminescent device, comprising:
   a) an anode layer;
   b) an organic light-emitting layer; and
   c) a cathode layer;
   the anode layer, or the anode layer and the cathode layer, comprising an oxide of Nb and at least one compound selected from the following group A,
   group A consisting of chalcogenides and nitrides of Si, Ge, Sn, Pb, Ga, In, Zn, Cd, Mg, Al, Ba, K, Li, Na, Ca, Sr, Cs, and Rb.

7. The organic electroluminescent device of claim 6, wherein the compounds of group A are selected from the group consisting of chalcogenides and nitrides of Sn, In, and Zn.

8. The organic electroluminescent device of claim 6, wherein either or both of the anode layer and the cathode layer has a specific resistance of less than 1 Ω·cm.

9. The organic electroluminescent device of claim 6, wherein the content of the oxide of Nb is in the range of 0.5 to 30 atomic % for 100 atomic % of the total of the anode layer or cathode layer.

10. The organic electroluminescent device of claim 6, wherein the anode layer or cathode layer has a thickness in the range of 1 to 100 nm.

11. The organic electroluminescent device of claim 6, wherein the anode layer comprises the oxide of Nb and the at least one compound selected from the group A.

12. An organic electroluminescent device, comprising:
   a) an anode layer;
   b) an organic light-emitting layer;
   c) a cathode layer; and
   either or both of a first inorganic thin layer formed between the anode layer and the organic light-emitting layer, and a second inorganic thin layer formed between the cathode layer and the organic light-emitting layer;
   the first and second inorganic thin layers comprising at least one inorganic compound other than In oxides, Sn oxides, Zn oxides, Ni oxides, Ti oxides, Zr oxides, Nb oxides, Ta oxides and Sr oxides;
   an intermediate level of the first inorganic thin layer being smaller than an ionization potential of the organic light-emitting layer, and greater than the work function of the anode; and an intermediate level of the second inorganic thin layer being greater than an electron affinity of the organic light-emitting layer, and smaller than a work function of the cathode.

* * * * *